US012408324B2

(12) United States Patent
Lee et al.

(10) Patent No.: US 12,408,324 B2
(45) Date of Patent: Sep. 2, 2025

(54) SEMICONDUCTOR MEMORY DEVICE

(71) Applicant: Samsung Electronics Co., Ltd., Suwon-si (KR)

(72) Inventors: Yongjin Lee, Hwaseong-si (KR); Yongseok Kim, Suwon-si (KR); Mintae Ryu, Hwaseong-si (KR); Huije Ryu, Suwon-si (KR); Sungwon Yoo, Hwaseong-si (KR); Wonsok Lee, Suwon-si (KR); Minhee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 366 days.

(21) Appl. No.: 18/081,905

(22) Filed: Dec. 15, 2022

(65) Prior Publication Data
US 2023/0292490 A1 Sep. 14, 2023

(30) Foreign Application Priority Data

Mar. 10, 2022 (KR) .................. 10-2022-0030326

(51) Int. Cl.
H10B 12/00 (2023.01)
(52) U.S. Cl.
CPC ......... *H10B 12/315* (2023.02); *H10B 12/482* (2023.02)
(58) Field of Classification Search
None
See application file for complete search history.

(56) References Cited

U.S. PATENT DOCUMENTS

| 8,614,479 | B2 | 12/2013 | Weng et al. |
| 9,246,013 | B2 | 1/2016 | Ahmed |
| 9,287,408 | B2 | 3/2016 | Yamazaki et al. |
| 11,139,396 | B2 | 10/2021 | Karda et al. |
| (Continued) | | | |

FOREIGN PATENT DOCUMENTS

| CN | 114664830 A | * | 6/2022 | ......... G11C 11/4023 |
| KR | 102247029 B1 | | 4/2021 | |

OTHER PUBLICATIONS

First Office Action issued Dec. 22, 2023 for corresponding TW Patent Application No. 112104592.

*Primary Examiner* — Steven M Page
(74) *Attorney, Agent, or Firm* — Muir Patent Law, PLLC

(57) ABSTRACT

A semiconductor memory device includes a substrate, a conductive line extending in a first horizontal direction above the substrate, an isolation insulating layer including a channel trench extending in a second horizontal direction intersecting with the first horizontal direction and extending from an upper surface to a lower surface of the isolation insulating layer, above the conductive line, a channel structure disposed above the conductive line, a gate electrode extending in the second horizontal direction, in the channel trench, a capacitor structure above the isolation insulating layer, and a contact structure interposed between the channel structure and the capacitor structure, wherein the channel structure includes an amorphous oxide semiconductor layer disposed in the channel trench above the conductive line, and an upper crystalline oxide semiconductor layer interposed between the amorphous oxide semiconductor layer and the contact structure.

20 Claims, 44 Drawing Sheets

(56) References Cited

U.S. PATENT DOCUMENTS

| | | | |
|---|---|---|---|
| 11,887,986 B2* | 1/2024 | Yoo | H10D 87/00 |
| 2012/0248434 A1* | 10/2012 | Kato | H10B 12/315 |
| | | | 257/532 |
| 2013/0069132 A1 | 3/2013 | Atsumi et al. | |
| 2016/0064525 A1 | 3/2016 | Yamazaki et al. | |
| 2017/0125436 A1* | 5/2017 | Sharangpani | H01L 21/02178 |
| 2020/0098930 A1 | 3/2020 | Le et al. | |
| 2020/0111800 A1* | 4/2020 | Ramaswamy | H10B 12/033 |
| 2020/0111908 A1 | 4/2020 | Sills et al. | |
| 2020/0111917 A1 | 4/2020 | Ramaswamy et al. | |
| 2022/0037504 A1* | 2/2022 | Sills | H10B 53/10 |

* cited by examiner

SEMICONDUCTOR MEMORY DEVICE

CROSS-REFERENCE TO RELATED APPLICATION(S)

This application is based on and claims priority under 35 U.S.C. § 119 to Korean Patent Application No. 10-2022-0030326, filed on Mar. 10, 2022, in the Korean Intellectual Property Office, the disclosure of which is incorporated by reference herein in its entirety.

BACKGROUND

The inventive concept relates to a semiconductor memory device. More particularly, the inventive concept relates to a semiconductor memory device including an oxide semiconductor.

As semiconductor memory devices are increasingly highly integrated, a control of a leakage current characteristic of a semiconductor memory device becomes more important. In order to reduce the leakage current of the semiconductor memory device, a channel layer including an oxide semiconductor material has been studied. The oxide semiconductor material has an on-current similar to that of silicon (Si) and high bandgap energy and thus has an excellent leakage current characteristic.

SUMMARY

The inventive concept provides a semiconductor memory device with improved performance and reliability due to improved electrical characteristics.

According to an aspect of the inventive concept, there is provided a semiconductor memory including a substrate, a conductive line extending in a first horizontal direction above the substrate, an isolation insulating layer including a channel trench extending in a second horizontal direction intersecting the first horizontal direction and extending from an upper surface to a lower surface of the isolation insulating layer, above the conductive line, a channel structure disposed above the conductive line, a gate electrode extending in the second horizontal direction, in the channel trench, a capacitor structure above the isolation insulating layer, and a contact structure interposed between the channel structure and the capacitor structure. The channel structure includes an amorphous oxide semiconductor layer disposed in the channel trench above the conductive line, and an upper crystalline oxide semiconductor layer interposed between the amorphous oxide semiconductor layer and the contact structure.

According to another aspect of the inventive concept, there is provided a semiconductor memory including a substrate, a conductive line extending in a first horizontal direction above the substrate, an isolation insulating layer including a channel trench extending in a second horizontal direction intersecting the first horizontal direction and extending from an upper surface to a lower surface of the isolation insulating layer, above the conductive line, a channel structure disposed above the conductive line, a gate electrode extending in the second horizontal direction, in the channel trench, a gate dielectric layer interposed between the channel structure and the gate electrode, in the channel trench, a capacitor structure above the isolation insulating layer, and a contact structure interposed between the channel structure and the capacitor structure. The channel structure includes a lower crystalline oxide semiconductor layer extending in the first horizontal direction above the conductive line, an amorphous oxide semiconductor layer disposed in the channel trench above the lower crystalline oxide semiconductor layer, and an upper crystalline oxide semiconductor layer interposed between the amorphous oxide semiconductor layer and the contact structure.

According to another aspect of the inventive concept, there is provided a semiconductor memory including a substrate, a conductive line extending in a first horizontal direction above the substrate, an isolation insulating layer including a channel trench extending in a second horizontal direction intersecting the first horizontal direction and extending from an upper surface to a lower surface of the isolation insulating layer, above the conductive line, a channel structure disposed above the conductive line, a gate electrode including a first gate electrode and a second gate electrode spaced apart from each other in the first horizontal direction to face each other in the channel trench and extending in the second horizontal direction, a gate dielectric layer interposed between the channel structure and the gate electrode, in the channel trench, a barrier insulating layer disposed between the first gate electrode and the second gate electrode, a gap-fill insulating layer formed on the barrier insulating layer and filling a region between the first gate electrode and the second gate electrode, a gate capping pattern covering upper surfaces of the gate electrode, the barrier insulating layer, and the gap-fill insulating layer, a capacitor structure above the isolation insulating layer and the gate capping pattern, and a contact structure interposed between the channel structure and the capacitor structure. The channel structure includes a lower crystalline oxide semiconductor layer having a lower surface covering an upper surface of the conductive line and extending in the first horizontal direction, an amorphous oxide semiconductor layer disposed in the channel trench above the lower crystalline oxide semiconductor layer and having a U-shaped vertical cross-section in the first horizontal direction, and first and second upper crystalline oxide semiconductor layers spaced apart from each other and interposed between the amorphous oxide semiconductor layer and the contact structure. The first upper crystalline oxide semiconductor is disposed above a first upper surface of the amorphous oxide semiconductor layer, and the second upper crystalline oxide semiconductor is disposed above a second upper surface of the amorphous oxide semiconductor layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
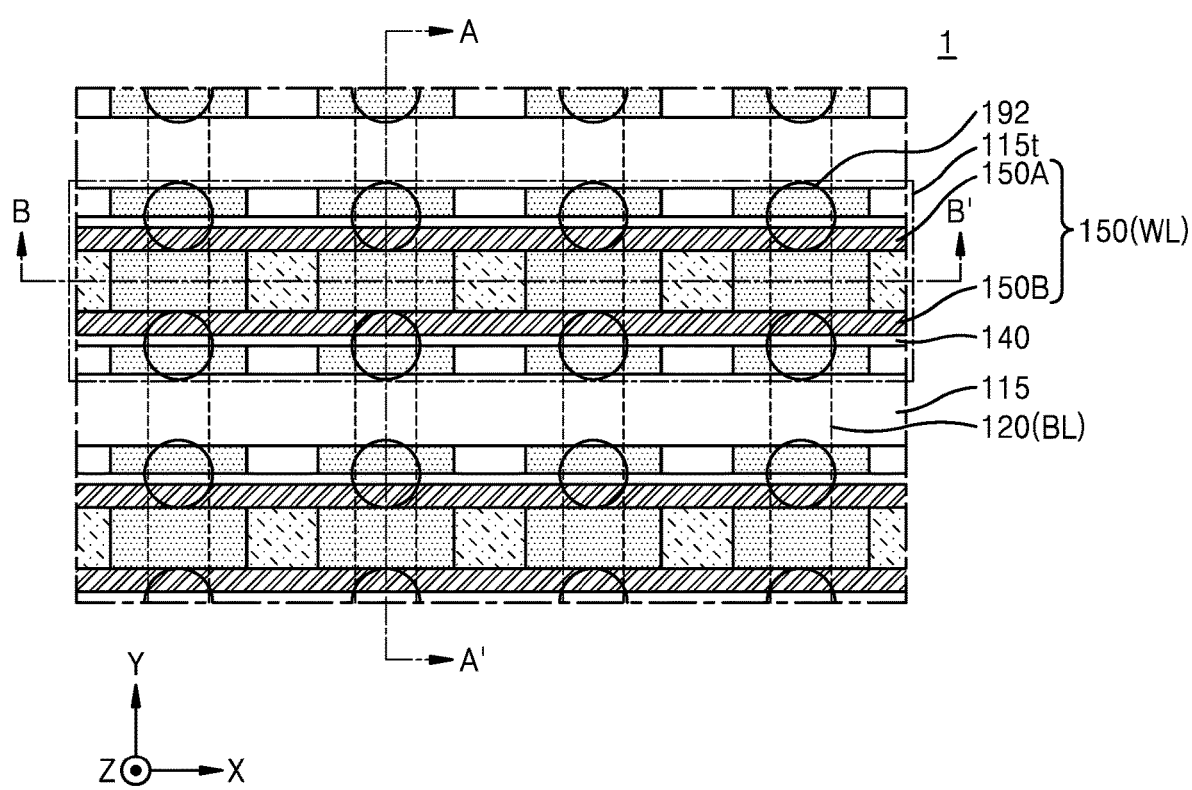
FIG. 1 is a layout diagram illustrating a semiconductor memory device according to example embodiments.
Figure 2A:
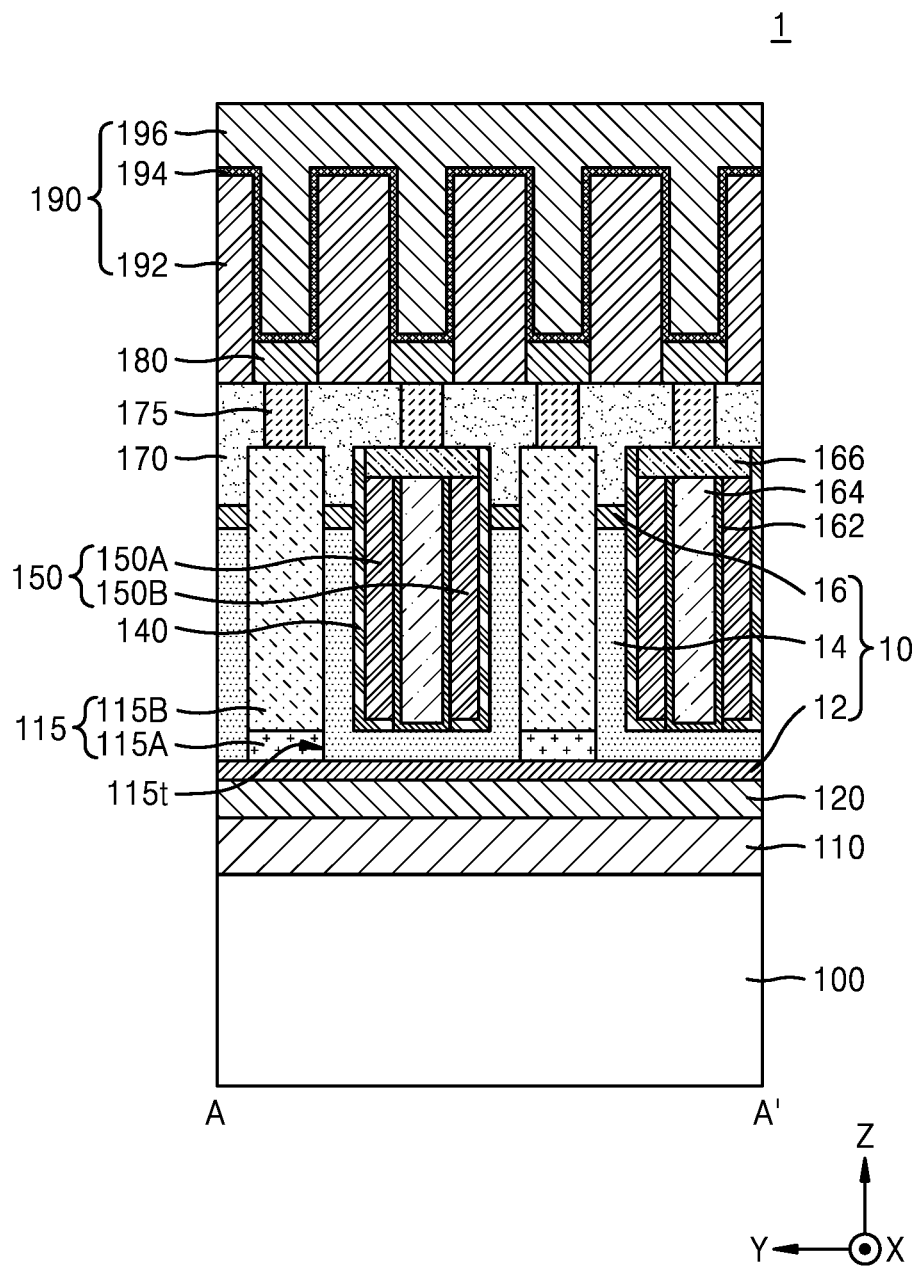
FIG. 2A is a cross-sectional view taken along line A-A' of FIG. 1 according to example embodiments.
Figure 2B:
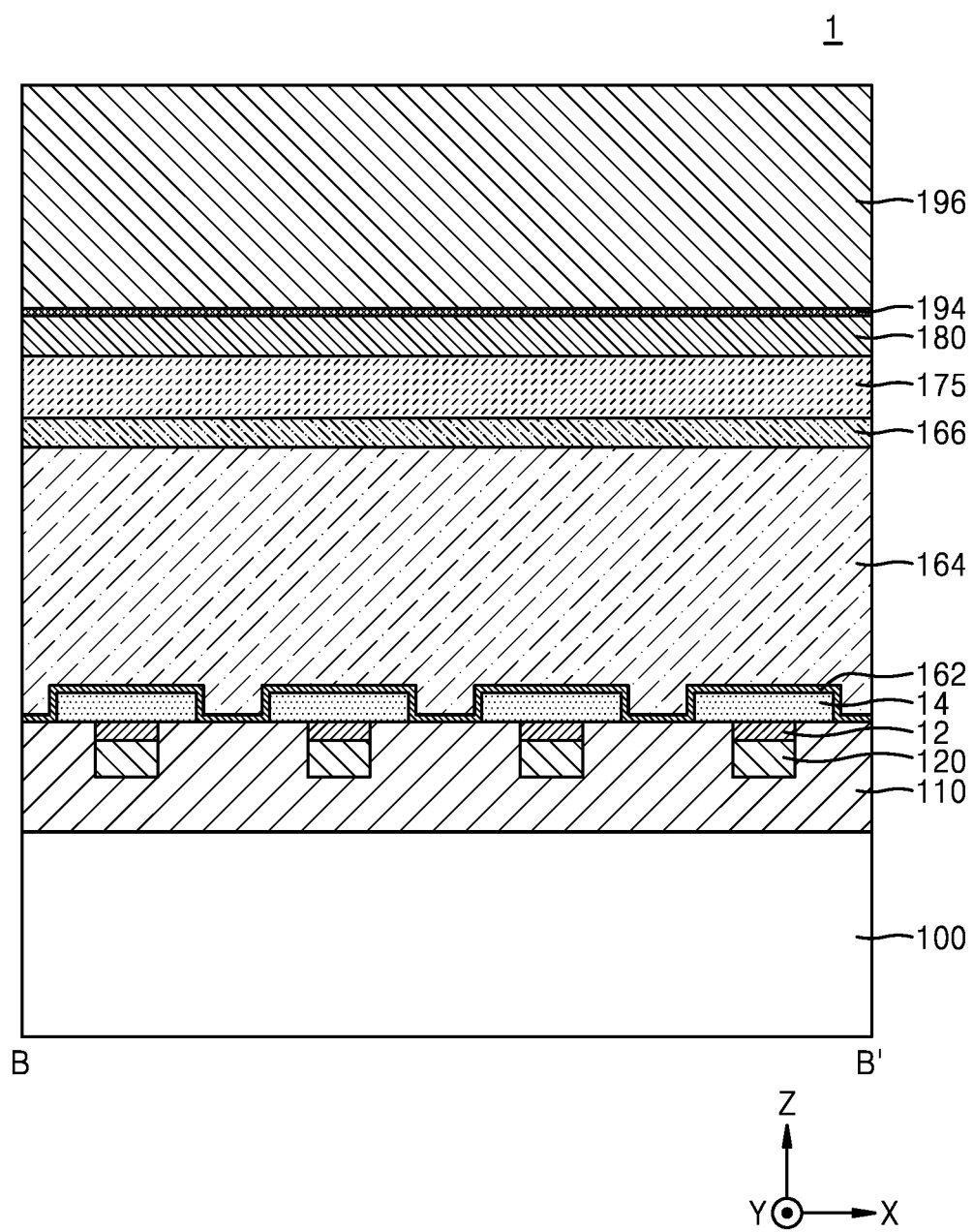
FIG. 2B is a cross-sectional view taken along line B-B' of FIG. 1 according to example embodiments.

FIG. 1 is a layout diagram illustrating a semiconductor memory device 1 according to example embodiments, FIG. 2A is a cross-sectional view taken along line A-A' of FIG. 1 according to example embodiments, and FIG. 2B is a cross-sectional view taken along line B-B' of FIG. 1 according to example embodiments.

Referring to FIGS. 1, 2A, and 2B together, the semiconductor memory device 1 may include a substrate 100, an interlayer insulating layer 110, a conductive line 120 (bit line BL), an isolation insulating layer 115, a channel structure 10, a gate dielectric layer 140, a gate electrode 150 (word line WL), a contact structure 170, and a capacitor structure 190.

The substrate 100 may include a semiconductor material, such as a group IV semiconductor material, a group III-V semiconductor material, or a group II-VI semiconductor material. The group IV semiconductor material may include, for example, silicon (Si), germanium (Ge), or silicon-germanium (Si—Ge). The group III-V semiconductor material may include, for example, gallium arsenide (GaAs), indium phosphate (InP), gallium phosphate (GaP), indium arsenide (InAs), indium antimony (InSb), or indium gallium arsenide (InGaAs). The group II-VI semiconductor material may include, for example, zinc telluride (ZnTe) or cadmium sulfide (CdS). The substrate 100 may be a bulk wafer or an epitaxial layer. The substrate 100 may have a structure in which a base substrate and an epitaxial layer are stacked, but is not limited thereto.

In some embodiments, logic cells constituting a core circuit, such as a sense amplifier, and electrically connected to the conductive line 120 may be disposed on the substrate 100 to overlap the channel structure 10, the gate electrode 150, and the capacitor structure 190 in a vertical direction (Z direction), but are not limited thereto. In some other embodiments, the logic cells constituting the core circuit may be disposed on a part of the substrate 100 that does not overlap the channel structure 10, the gate electrode 150, and the capacitor structure 190 in the vertical direction (Z direction).

A plurality of conductive lines 120 may be formed above the substrate 100. For example, the interlayer insulating layer 110 may be formed above the substrate 100, and the plurality of conductive lines 120 may be disposed on the interlayer insulating layer 110. For example, the interlayer insulating layer 110 may cover a lower surface and side surfaces of each of the plurality of conductive lines 120. The plurality of conductive lines 120 may be spaced apart from each other at equal intervals in a first horizontal direction (X direction), and may each extend in a second horizontal direction (Y direction) crossing the first horizontal direction (X direction). Each of the plurality of conductive lines 120 may extend long in the second horizontal direction (Y direction). The first horizontal direction (X direction) and the second horizontal direction (Y direction) may be orthogonal to each other.

The interlayer insulating layer 110 may be formed to cover side surfaces of the plurality of conductive lines 120 and to fill spaces between the plurality of conductive lines 120. The interlayer insulating layer 110 may be a single layer including one type of insulating material, or a multilayer including a combination of several types of insulating materials. For example, the interlayer insulating layer 110 may be configured as a multi-layer including at least one layer covering the lower surface of the conductive line 120 and at a lower vertical level than that of the conductive line 120, and at least one layer covering the side surfaces of the conductive line 120 and at a higher vertical level than that of the lower surface of the conductive line 120 The conductive line 120 may function as a bit line BL of the semiconductor memory device 1.

The conductive line 120 may include doped polysilicon, metal, conductive metal nitride, conductive metal silicide, conductive metal oxide, or a combination thereof. For example, the conductive line 120 may include doped polysilicon, Al, Cu, Ti, Ta, Ru, W, Mo, Pt, Ni, Co, TiN, TaN, WN, WSi, NbN, TiAl, TiAlN, TiSi, TiSiN, TaSi, TaSiN, RuTiN, NiSi, CoSi, IrO$_x$, RuO$_x$, or a combination thereof, but is not limited thereto. Alternatively, the conductive line 120 may include a 2D semiconductor material. The 2D semiconductor material may include, for example, graphene, carbon nanotube, or a combination thereof. The conductive line 120 may include a single layer or a multi-layer of the described conductive materials above.

The channel structure 10 may be disposed above the conductive line 120. The channel structure 10 may include a quaternary oxide semiconductor material including a first metal element, a second metal element, and a third metal element that is different from the first metal element and the second metal element. The channel structure 10 may include a lower crystalline oxide semiconductor layer 12, an amorphous oxide semiconductor layer 14, and an upper crystalline oxide semiconductor layer 16. The lower crystalline oxide semiconductor layer 12 may be in contact with a lower surface of the amorphous oxide semiconductor layer 14, and the upper crystalline oxide semiconductor layer 16 may be in contact with an upper surface of the amorphous oxide semiconductor layer 14. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Each of the lower crystalline oxide semiconductor layer 12, the amorphous oxide semiconductor layer 14, and the upper crystalline oxide semiconductor layer 16 may include a binary oxide semiconductor material including a first metal element, a ternary oxide semiconductor material including a first metal element and a second metal element that are different from each other, or a quaternary oxide semiconductor material including a first metal element, a second metal element, and a third metal element that is different from the first metal element and the second metal element. The lower crystalline oxide semiconductor layer 12 may include a crystalline binary oxide semiconductor material, a crystalline ternary oxide semiconductor material, or a crystalline quaternary oxide semiconductor material. The amorphous oxide semiconductor layer 14 may include an amorphous binary oxide semiconductor material, an amorphous ternary oxide semiconductor material, or an amorphous quaternary oxide semiconductor material. The upper crystalline oxide semiconductor layer 16 may include a crystalline binary oxide semiconductor material, a crystalline ternary oxide semiconductor material, or a crystalline quaternary oxide semiconductor material.

The binary or ternary oxide semiconductor material may be one of, for example, ZnO (zinc oxide, ZnxO), GaO (gallium oxide, GaxO), TO (tin oxide, SnxO), ZnON (zinc oxynitride, $Zn_xO_yN$), IZO (indium zinc oxide, $In_xZnyO$), GZO (gallium zinc oxide, $Ga_xZn_yO$), TZO (tin zinc oxide, $Sn_xZn_yO$), and TGO (tin gallium oxide, SnxGayO), but is not limited thereto. The quaternary oxide semiconductor material may be any one of, for example, IGZO (indium gallium zinc oxide, $In_xGa_yZn_zO$), IGSO (indium gallium silicon oxide, $In_xGa_ySi_zO$), ITZO (indium tin zinc oxide, $In_xSn_yZn_zO$), ITGO (indium tin gallium oxide, $In_xSn_yGa_zO$), ZZTO (zirconium zinc tin oxide, $Zr_xZn_ySn_zO$), HIZO (hafnium indium zinc oxide, $Hf_xIn_yZn_zO$), GZTO (gallium zinc tin oxide, $Ga_xZn_ySn_zO$), AZTO (aluminium zinc tin oxide, $Al_xZn_ySn_zO$), and YGZO (ytterbium gallium zinc oxide, $Yb_xGa_yZn_zO$), but is not limited thereto.

In some embodiments, each of the lower crystalline oxide semiconductor layer 12, the amorphous oxide semiconductor layer 14, and the upper crystalline oxide semiconductor layer 16 may include a quaternary oxide semiconductor material. For example, the lower crystalline oxide semiconductor layer 12 may include at least one of single crystalline IGZO (IGZO), polycrystalline IGZO, spinel IGZO, or c-axis aligned crystalline IGZO (CAAC IGZO). For example, the amorphous oxide semiconductor layer 14 may include amorphous IGZO (IGZO). For example, the upper crystalline oxide semiconductor layer 16 may include at least one of monocrystalline or single crystalline IGZO, polycrystalline IGZO, spinel IGZO, or CAAC IGZO.

The lower crystalline oxide semiconductor layer 12 may be between the conductive line 120 and the amorphous oxide semiconductor layer 14. The lower crystalline oxide semiconductor layer 12 may have a thickness of several nm in the vertical direction (Z direction). For example, the lower crystalline oxide semiconductor layer 12 may have a thickness of about 5 nm to about 9 nm in the vertical direction (Z direction). The lower crystalline oxide semiconductor layer 12 may extend long in the second horizontal direction (Y direction). The lower crystalline oxide semiconductor layer 12 may include a plurality of lower crystalline oxide semiconductor layers 12 respectively corresponding to the plurality of conductive lines 120. The plurality of lower crystalline oxide semiconductor layers 12 may respectively cover upper surfaces of the plurality of corresponding conductive lines 120. In some embodiments, the plurality of lower crystalline oxide semiconductor layers 12 may entirely and respectively cover upper surfaces of the plurality of corresponding conductive lines 120. The plurality of lower crystalline oxide semiconductor layers 12 and the plurality of conductive lines 120, which respectively correspond to one another, may overlap each other in the vertical direction (Z direction). For example, both sides of the plurality of lower crystalline oxide semiconductor layers 12 and both sides of the plurality of conductive lines 120, which respectively correspond to one another, in the first horizontal direction (X direction) may be aligned in the vertical direction (Z direction). The plurality of lower crystalline oxide semiconductor layers 12 may each extend in the second horizontal direction (Y direction) and may be spaced apart from each other at equal intervals in the first horizontal direction (X direction). Side surfaces of the plurality of lower crystalline oxide semiconductor layers 12 may be covered by the interlayer insulating layer 110. An upper surface of the interlayer insulating layer 110 and the upper surfaces of the plurality of lower crystalline oxide semiconductor layers 12 may be at the same vertical level to be coplanar with each other.

The isolation insulating layer 115 may be disposed above the conductive line 120. For example, the isolation insulating layer 115 may be disposed above the lower crystalline oxide semiconductor layer 12 covering the upper surface of the conductive line 120. In some embodiments, a lower surface of the isolation insulating layer 115, that is, the lower surface of the lower isolation insulating layer 115A, may be in contact with the upper surface of the lower crystalline oxide semiconductor layer 12. For example, the lower surface of the lower isolation insulating layer 115A and the upper surface of the lower crystalline oxide semiconductor layer 12 may be positioned at the same vertical level.

The isolation insulating layer 115 may have a channel trench 115t extending long in the first horizontal direction (X direction). In some embodiments, the horizontal width of the channel trench 115t may be several tens nm to several hundreds nm. For example, the horizontal width of the channel trench 115t may be about 100 nm. The channel trench 115t may extend from the upper surface to the lower surface of the isolation insulating layer 115. For example, the isolation insulating layer 115 may include a plurality of isolation insulating layers 115 each extending in the first horizontal direction (X direction) and spaced apart from each other by the channel trench 115t. The channel trench 115t may expose at least a part of the lower crystalline oxide semiconductor layer 12. For example, the upper surface of the lower crystalline oxide semiconductor layer 12 may be exposed on the bottom surface of the channel trench 115t.

The isolation insulating layer 115 may include at least one of, for example, silicon oxide, silicon oxynitride, silicon nitride, or a low-k material having a dielectric constant smaller than that of silicon oxide, but is not limited thereto. In some embodiments, the isolation insulating layer 115 may have a stack structure of a lower isolation insulating layer 115A and an upper isolation insulating layer 115B. In some embodiments, the lower isolation insulating layer 115A may include nitride, and the upper isolation insulating layer 115B may include oxide.

The amorphous oxide semiconductor layer 14 may be disposed in the channel trench 115t above the conductive line 120. For example, the amorphous oxide semiconductor layer 14 may be disposed above the lower crystalline oxide semiconductor layer 12 covering the upper surface of the conductive line 120. The lower crystalline oxide semiconductor layer 12 may be between the amorphous oxide semiconductor layer 14 and the conductive line 120. The amorphous oxide semiconductor layer 14 may have a thickness of several tens nm in the vertical direction (Z direction), and may have a thickness of several nm in the second horizontal direction (Y direction). For example, the amorphous oxide semiconductor layer 14 may have a thickness of about 5 nm to about 9 nm in the second horizontal direction (Y direction).

The amorphous oxide semiconductor layer 14 may be formed in the channel trench 115t. For example, the amorphous oxide semiconductor layer 14 may extend along side surfaces and the bottom surface of the channel trench 115t. For example, the amorphous oxide semiconductor layer 14 may extend on a part of the isolation insulating layer 115 positioned on the side surfaces of the channel trench 115t and a part of the lower crystalline oxide semiconductor layer 12 positioned on the bottom surface of the channel trench 115t. The amorphous oxide semiconductor layer 14 may be electrically connected to the conductive line 120. For example, the lower surface of the amorphous oxide semiconductor layer 14 extending along the lower surface of the channel trench 115t may be in contact with the upper surface of the lower crystalline oxide semiconductor layer 12.

In some embodiments, a plurality of amorphous oxide semiconductor layers 14 spaced apart from each other may be disposed above the conductive line 120. The plurality of amorphous oxide semiconductor layers 14 may be spaced apart from each other in the first horizontal direction (X direction) and the second horizontal direction (Y direction) to be arranged in a matrix form. For example, above one lower crystalline oxide semiconductor layer 12 covering the upper surface of one conductive line 120, the plurality of amorphous oxide semiconductor layers 14 may be disposed to be spaced apart from each other in the second horizontal direction (Y direction). Each of the plurality of amorphous oxide semiconductor layers 14 may have a U-shaped vertical cross-section. For example, each of the plurality of amorphous oxide semiconductor layers 14 may have a U-shape in a cross-section (Y-Z plane) in the second horizontal direction (Y direction) and the vertical direction (Z direction).

In the present specification, unless otherwise specified, the vertical cross-section is a vertical cross-section in an extension direction of the conductive line 120 and the lower crystalline oxide semiconductor layer 12, that is, a vertical cross-section (Y-Z plane) in the second horizontal direction (Y direction).

The upper crystalline oxide semiconductor layer 16 may be disposed above the amorphous oxide semiconductor layer 14. For example, the upper crystalline oxide semiconductor layer 16 may be disposed above the uppermost surface of the amorphous oxide semiconductor layer 14. The upper crystalline oxide semiconductor layer 16 may have a thickness of several nm in the vertical direction (Z direction). For example, the upper crystalline oxide semiconductor layer 16 may have a thickness of about 5 nm to about 9 nm in the vertical direction (Z direction). When the amorphous oxide semiconductor layer 14 has a U-shaped vertical cross-section, two upper crystalline oxide semiconductor layers 16 spaced apart from each other may be disposed above one amorphous oxide semiconductor layer 14. For example, one upper crystalline oxide semiconductor layer 16 may be disposed above a first upper surface of the amorphous oxide semiconductor layer 14, and another upper crystalline oxide semiconductor layer 16 may be disposed above a second upper surface of the amorphous oxide semiconductor layer 14. For example, one amorphous oxide semiconductor layer 14 and two upper crystalline oxide semiconductor layers 16 may have the U-shaped vertical cross-section together.

The lower surface of the upper crystalline oxide semiconductor layer 16 and the uppermost surface of the amorphous oxide semiconductor layer 14 may overlap and contact each other. The upper crystalline oxide semiconductor layer 16 may be positioned above a part of the lower crystalline oxide semiconductor layer 12 positioned on the side surface of the channel trench 115t. For example, along the upper surface from the lower surface of the isolation insulating layer 115, the amorphous oxide semiconductor layer 14 and the upper crystalline oxide semiconductor layer 16 may be arranged sequentially while contacting a part of the isolation insulating layer 115 positioned on the side surfaces of the channel trench 115t. In some embodiments, the upper surface of the upper crystalline oxide semiconductor layer 16 may be positioned at a lower vertical level than that of an upper surface of the isolation insulating layer 115. In some embodiments, the upper surface of the upper crystalline oxide semiconductor layer 16 may be positioned at a lower vertical level than that of the upper surface of the gate electrode 150.

The semiconductor memory device 1 may be a semiconductor memory device including a vertical channel transistor (VCT). The VCT may refer to a structure in which a channel length of a channel layer, for example, the channel structure 10, extends in the vertical direction (Z direction) perpendicular to the upper surface of the substrate 100. For example, the channel structure 10 may include a first source/drain region and a second source/drain region that are arranged in the vertical direction (Z direction).

The lower crystalline oxide semiconductor layer 12 of the channel structure 10 may function as a lower contact layer for reducing a contact resistance between the conductive line 120 and the amorphous oxide semiconductor layer 14, and the upper crystalline oxide semiconductor layer 16 of the channel structure 10 may function as an upper contact layer for reducing a contact resistance between the amorphous oxide semiconductor layer 14 and the contact structure 170.

In some embodiments, the amorphous oxide semiconductor layer 14 may include a first source/drain region and a second source/drain region that are arranged in the vertical direction (Z direction). For example, the lower portion of the amorphous oxide semiconductor layer 14 may function as the first source/drain region, and the upper portion of the amorphous oxide semiconductor layer 14 may function as the second source/drain region. A part of the amorphous oxide semiconductor layer 14 between the first source/drain region and the second source/drain region may function as a channel region.

In some other embodiments, the lower crystalline oxide semiconductor layer 12 may function as the first source/drain region, the upper crystalline oxide semiconductor layer 16 may function as the second source/drain region, and the amorphous oxide semiconductor layer 14 may entirely function as a channel region.

The gate dielectric layer 140 may be formed on the channel structure 10 in the channel trench 115t. The gate dielectric layer 140 may be between the channel structure 10 and the gate electrode 150. In some embodiments, the uppermost end of the gate dielectric layer 140 may be positioned at a higher vertical level than that of the uppermost end of the gate electrode 150. The gate dielectric layer 140 may be disposed above the amorphous oxide semiconductor layer 14 and the upper crystalline oxide semiconductor layer 16. For example, along inner surfaces of one amorphous oxide semiconductor layer 14 and two upper crystalline oxide semiconductor layers 16 that form the U-shaped vertical cross-section, two gate dielectric layers 140 having an L-shaped vertical cross-section, facing each other, and spaced apart from each other may be disposed. In some embodiments, the uppermost end of the gate dielectric layer 140 may extend in the vertical direction (Z direction) along inner surfaces of one amorphous oxide semiconductor layer 14 and two upper crystalline oxide semiconductor layers 16 that form the U-shaped vertical cross-section, so as to be positioned at a higher vertical level than that of the uppermost end of the upper crystalline oxide semiconductor layer 16. The gate dielectric layer 140 may include at least one of, for example, silicon oxide, silicon oxynitride, silicon nitride, or a high-k material having a dielectric constant that is greater than that of silicon oxide, but is not limited thereto.

The gate electrode 150 may be formed on the gate dielectric layer 140 in the channel trench 115t. The gate electrode 150 may cover the gate dielectric layer 140 in the channel trench 115t and extend in the vertical direction (Z direction). The gate electrode 150 may extend long in the first horizontal direction (X direction). The gate electrode 150 may include doped polysilicon, metal, conductive metal nitride, conductive metal silicide, conductive metal oxide, or a combination thereof. For example, the gate electrode 150 may include doped polysilicon, Al, Cu, Ti, Ta, Ru, W, Mo, Pt, Ni, Co, TiN, TaN, WN, NON, TiAl, TiAlN, TiSi, TiSiN, TaSi, TaSiN, RuTiN, NiSi, CoSi, IrOx, RuOx, or a combination thereof, but is not limited thereto.

In some embodiments, the gate electrode 150 may include a first gate electrode 150A and a second gate electrode 150B that face each other in one channel trench 115t. The first gate electrode 150A and the second gate electrode 150B may be spaced apart from each other in the second horizontal direction (Y direction) and may each extend long in the first horizontal direction (X direction). In one channel trench 115t, two gate dielectric layers 140 may be disposed respectively between the channel structure 10 and the first gate electrode 150A and between the channel structure 10 and the second gate electrode 150B. The gate dielectric layer 140 disposed between the channel structure 10 and the first gate electrode 150A and the gate dielectric layer 140 disposed between the channel structure 10 and the second gate electrode 150B may have the L-shaped vertical cross-section and may be spaced apart from each other facing each other. In this case, two transistor structures per one channel structure 10 may be implemented. For example, the first gate electrode 150A may function as a first word line of the semiconductor memory device 1, and the second gate electrode 150B may function as a second word line of the semiconductor memory device 1.

In some embodiments, a barrier insulating layer 162 and a gap-fill insulating layer 164 may be formed between the first gate electrode 150A and the second gate electrode 150B. The first gate electrode 150A and the second gate electrode 150B may be separated from each other by the barrier insulating layer 162 and the gap-fill insulating layer 164. The barrier insulating layer 162 may extend along, for example, the inner surface of the first gate electrode 150A, the upper surface of the amorphous oxide semiconductor layer 14, and the inner surface of the second gate electrode 150B to have the U-shaped vertical cross-section. The gap-fill insulating layer 164 may be formed on the barrier insulating layer 162 to fill the inside of the U-shaped vertical cross-section of the barrier insulating layer 162, and filled in a region between the first gate electrode 150A and the second gate electrode 150B.

The barrier insulating layer 162 and the gap-fill insulating layer 164 may separate the gate electrode 150 into the first gate electrode 150A and the second gate electrode 150B, which are opposed to each other in one channel trench 115t but may not separate the amorphous oxide semiconductor layer 14. The barrier insulating layer 162 may be in contact with the amorphous oxide semiconductor layer 14 but may be not in contact with the lower crystalline oxide semiconductor layer 12. For example, the lowermost surface of the barrier insulating layer 162 may be formed to be higher than the lowermost surface of the amorphous oxide semiconductor layer 14.

Each of the barrier insulating layer 162 and the gap-fill insulating layer 164 may include at least one of silicon oxide, silicon oxynitride, silicon nitride, or a combination thereof, but is not limited thereto. For example, the barrier insulating layer 162 may include silicon nitride, and the gap-fill insulating layer 164 may include silicon oxide.

A gate capping pattern 166 may be formed above the gate electrode 150. The gate capping pattern 166 may cover, for example, the upper surface of the gate electrode 150, the upper surface of the barrier insulating layer 162, and the upper surface of the gap-fill insulating layer 164. The gate capping pattern 166 may include silicon nitride, but is not limited to. In some embodiments, the gate dielectric layer 140 may extend further away from the substrate 100 in the vertical direction (Z direction) to cover the side surfaces of the gate electrode 150 and the side surfaces of the gate capping pattern 166. In some embodiments, the upper surface of the gate dielectric layer 140 and the upper surface of the gate capping pattern 166 may be positioned at the same vertical level to be coplanar with each other.

The contact structure 170 may be formed above the channel structure 10. For example, the contact structure 170 may be connected to the upper surface of the upper crystalline oxide semiconductor layer 16. The contact structure 170 may extend between the isolation insulating layer 115 and the gate dielectric layer 140 from upper surfaces of the isolation insulating layer 115 and the gate capping pattern 166. In some embodiments, the lowermost end of the contact structure 170 may be positioned at a lower vertical level than that of the lower surface of the gate electrode 150. The contact structure 170 may connect the channel structure 10 to the capacitor structure 190. The contact structure 170 may include at least one of, for example, a conductive material, such as metal, conductive metal nitride, conductive metal carbonitride, conductive metal carbide, metal silicide, a doped semiconductor material, conductive metal oxynitride, conductive metal oxide, or a two-dimensional (2D) material, but is not limited thereto.

The contact structure 170 may include a plurality of contact structures 170 separated by an insulating structure 175. The insulating structure 175 may have a plurality of recesses covering above the isolation insulating layer 115 and the gate capping pattern 166, and through which the channel structure 10 is exposed in the bottom surface, and the plurality of contact structures 170 may be respectively filled in the plurality of recesses. The insulating structure 175 may include nitride. In FIGS. 2A and 2B, the upper surface of the insulating structure 175 and upper surfaces of the plurality of contact structures 170 are positioned at the same vertical level, but the inventive concept is not limited thereto. For example, the upper surface of the insulating structure 175 may be positioned at a higher level than those of the upper surfaces of the plurality of contact structures 170.

In FIGS. 2A and 2B, a lower surface of the insulating structure 175 is at the same vertical level as that of the upper surface of the isolation insulating layer 115 and the upper surface of the gate capping pattern 166, but is not limited thereto. In some embodiments, the insulating structure 175 may extend into the isolation insulating layer 115 and the gate capping pattern 166 so that the lower surface of the insulating structure 175 is positioned at a lower vertical level than that of the upper surface of the isolation insulating layer 115 and the upper surface of the gate capping pattern 166.

In some embodiments, two contact structures 170 may be formed per one amorphous oxide semiconductor layer 14 in the second horizontal direction (Y direction). For example, the upper surface of the channel structure 10 adjacent to the first gate electrode 150A may be connected to one contact structure 170, and the upper surface of the channel structure 10 adjacent to the second gate electrode 150B may be connected to another contact structure 170.

The contact structure 170 may cover the upper surface of the isolation insulating layer 115 and the gate capping pattern 166, and may extend between the isolation insulating layer 115 and the gate dielectric layer 140 toward the substrate 100.

A support insulating layer 180 may be disposed above the plurality of contact structures 170 and the insulating structure 175. The support insulating layer 180 may cover the plurality of contact structures 170 and the insulating structure 175, and may have a plurality of holes through which the plurality of contact structures 170 are exposed in bottom surfaces. The support insulating layer 180 may include, for example, a silicon nitride layer or silicon boron nitride (SiBN).

The plurality of capacitor structures 190 may be formed above the plurality of contact structures 170. The plurality of capacitor structures 190 may be connected to upper surfaces of the plurality of corresponding contact structures 170. The capacitor structure 190 may be controlled by the conductive line 120 and the gate electrode 150 to store data.

The plurality of capacitor structures 190 may include a plurality of lower electrodes 192, a capacitor dielectric layer 194, and an upper electrode 196. Each of the plurality of capacitor structures 190 may store electric charges in the capacitor dielectric layer 194 by using a potential difference generated between the lower electrode 192 and the upper electrode 196.

The plurality of lower electrodes 192 may be respectively connected to the plurality of contact structures 170. For example, the plurality of lower electrodes 192 may be connected to the upper surface of the contact structure 170 exposed in the bottom surfaces of the plurality of holes of the support insulating layer 180. In FIG. 2A, the lower electrode 192 has only a pillar shape extending in the vertical direction (Z direction) from the upper surface of the contact structure 170, but this is an example. In some other embodiments, the lower electrode 192 may have a cylinder shape extending in the vertical direction (Z direction) from the upper surface of the contact structure 170. In some embodiments, the plurality of lower electrodes 192 may be arranged in a matrix form. In some other embodiments, the plurality of lower electrodes 192 may be arranged in a honeycomb shape. The lower electrode 192 may include silicon doped with impurities, metal, such as tungsten or copper, or a conductive metal compound such as titanium nitride.

The capacitor dielectric layer 194 may be formed on the plurality of lower electrodes 192. In some embodiments, the capacitor dielectric layer 194 may conformally extend along profiles of the side surfaces and upper surfaces of the plurality of lower electrodes 192 and the upper surface of the support insulating layer 180. The capacitor dielectric layer 194 may include, for example, TaO, TaAlO, TaON, AlO, AlSiO, HfO, HfSiO, ZrO, ZrSiO, TiO, TiAlO, BST ((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or a combination thereof.

The upper electrode 196 may be formed on the capacitor dielectric layer 194. The upper electrode 196 may include a metal material. For example, the upper electrode 196 may include W, Ru, RuO, Pt, PtO, Ir, IrO, SRO (SrRuO), BSRO ((Ba,Sr) RuO), CRO (CaRuO), BaRuO, La (Sr,Co) O, or a combination thereof. In some embodiments, the upper electrode 196 may further include at least one of a doped semiconductor material layer and an interface layer, in addition to a metal material, to have a stack structure thereof. The doped semiconductor material layer may include, for example, at least one of doped polysilicon and doped polycrystalline silicon germanium (SiGe). The main electrode layer may include a metal material. The interface layer may include, for example, at least one of a metal oxide, a metal nitride, a metal carbide, or a metal silicide. In FIG. 2A, the upper electrode 196 only fills the region between the adjacent lower electrodes 192, but this is only an example. As another example, the upper electrode 196 may conformally extend along the profile of the capacitor dielectric layer 194.

The semiconductor memory device 1 according to the inventive concept may include the channel structure 10 including the lower crystalline oxide semiconductor layer 12 and the upper crystalline oxide semiconductor layer 16. The lower crystalline oxide semiconductor layer 12 may reduce the contact resistance between the conductive line 120 and the amorphous oxide semiconductor layer 14, and the upper crystalline oxide semiconductor layer 16 may reduce the contact resistance between the amorphous oxide semiconductor layer 14 and the contact structure 170.

Accordingly, an electrical characteristic of the semiconductor memory device 1 may be improved, and thus, the performance and reliability of the semiconductor memory device 1 may be improved.

FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16, 17, 18A, 18B, 19A, 19B, 20A, and 20B are cross-sectional views illustrating a method of manufacturing the semiconductor memory device 1, according to example embodiments. Specifically, FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16, 17, 18A, 18B, 19A, 19B, 20A, and 20B are cross-sectional views illustrating the method of manufacturing the semiconductor memory device 1 shown in FIGS. 1, 2A, and 2B, FIGS. 3A, 4A, 5A, 6A, 7A, 8A, 9A, 10A, 11A, 12A, 13A, 14A, 15A, 16, 17, 18A, 19A, and 20A are cross-sectional views taken along a part corresponding to A-A' in FIG. 1, and FIGS. 3B, 4B, 5B, 6B, 7B, 8B, 9B, 10B, 11B, 12B, 13B, 14B, 15B, 18B, 19B, and 20B are cross-sectional views taken along a part corresponding to B-B' in FIG. 1.

Figure 3A:
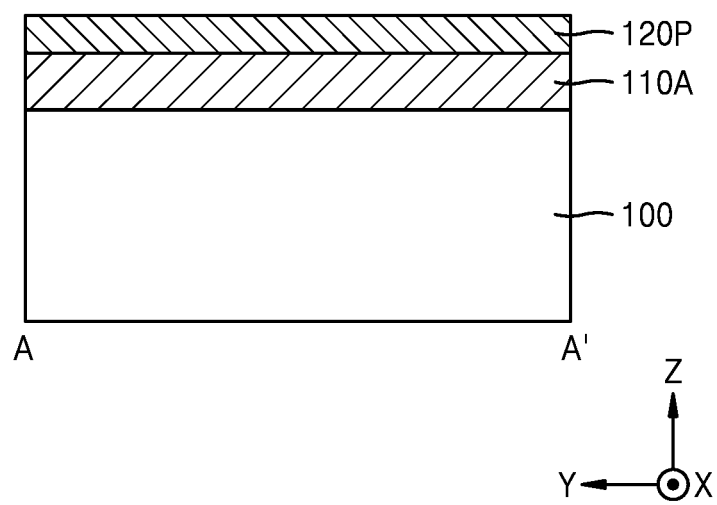
FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16, 17, 18A, 18B, 19A, 19B, 20A, and 20B are cross-sectional views illustrating a method of manufacturing a semiconductor memory device, according to example embodiments.
Figure 3B:
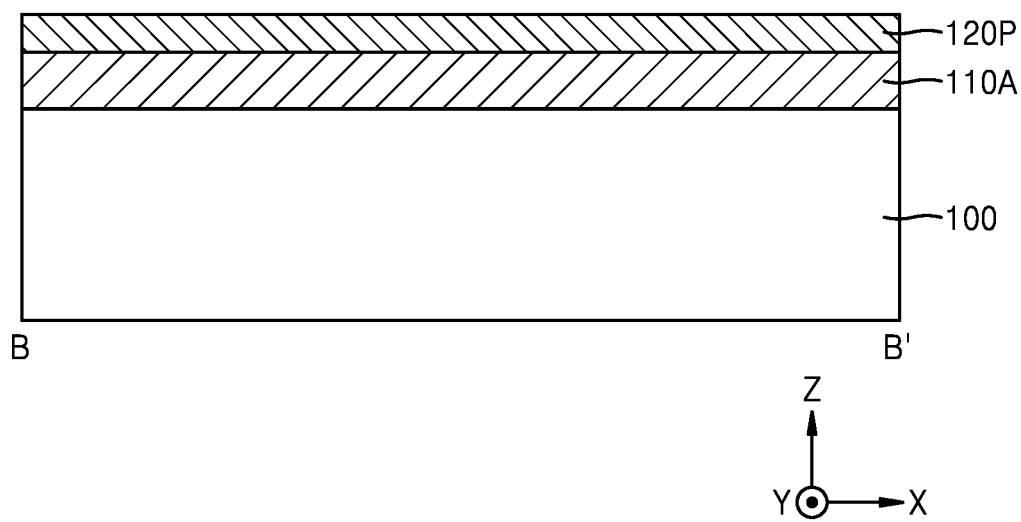

Referring to FIGS. 3A and 3B together, a conductive material layer 120P is formed above the substrate 100. The conductive material layer 120P may be formed to include doped polysilicon, metal, conductive metal nitride, conductive metal silicide, conductive metal oxide, or a combination thereof.

Before forming the conductive material layer 120P, a first interlayer insulating layer 110A covering the upper surface of the substrate 100 may be formed. The conductive material layer 120P may be formed to cover the upper surface of the first interlayer insulating layer 110A.

Figure 4A:
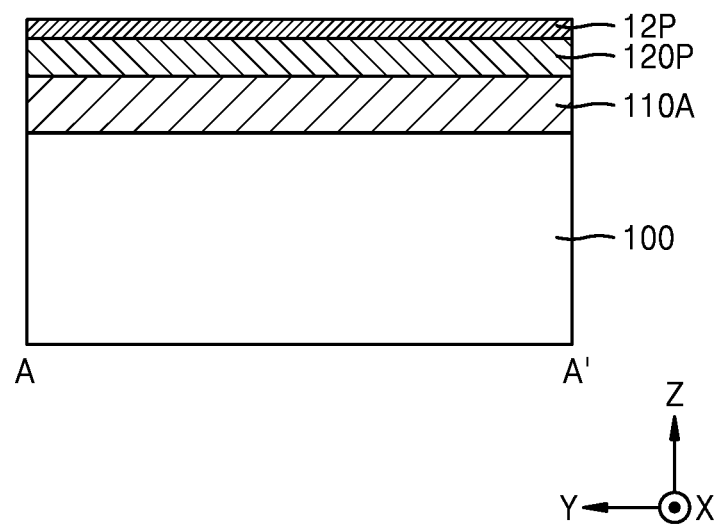
Figure 4B:
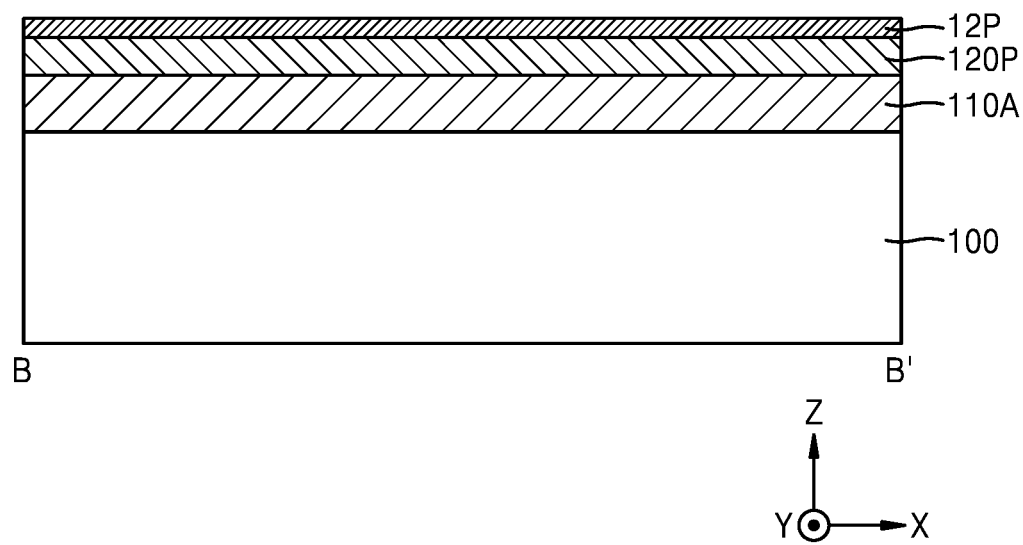
Figure 5A:
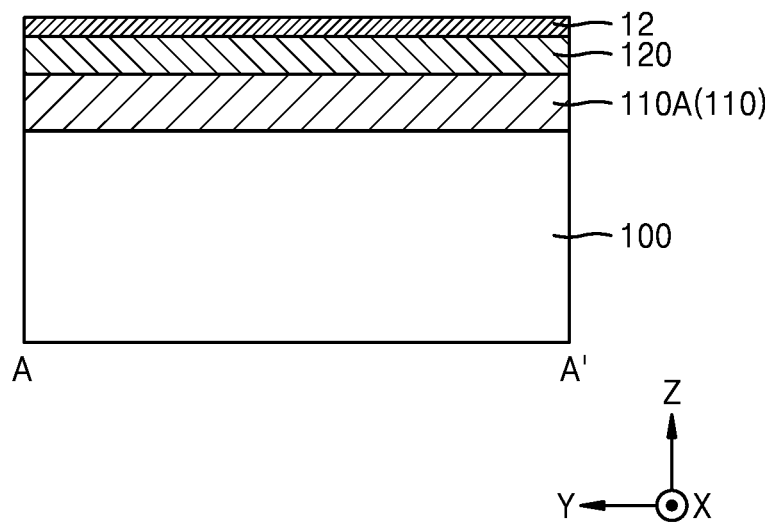
Figure 5B:
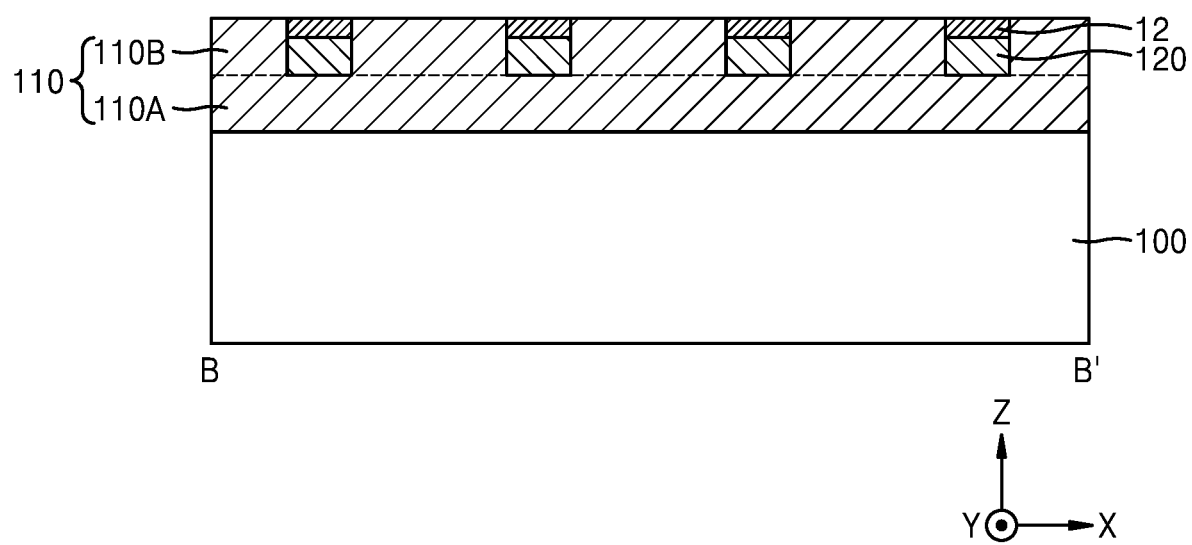

Referring to FIGS. 4A and 4B together, a preliminary lower crystalline oxide semiconductor layer 12P covering the upper surface of the conductive material layer 120P is formed. The preliminary lower crystalline oxide semiconductor layer 12P may be formed to include a crystalline quaternary oxide semiconductor material.

Referring to FIGS. 4A, 4B, 5A and 5B together, a plurality of conductive lines 120 and a plurality of lower crystalline oxide semiconductor layer 12 are formed by patterning the conductive material layer 120P and the preliminary lower crystalline oxide semiconductor layer 12P together. The plurality of conductive lines 120 and the plurality of lower crystalline oxide semiconductor layers 12 may extend in the second horizontal direction (Y direction) and may be formed to be spaced apart from each other at equal intervals in the first horizontal direction (X direction).

After forming the plurality of conductive lines 120 and the plurality of lower crystalline oxide semiconductor layers 12, a second interlayer insulating layer 110B surrounding side surfaces of the plurality of conductive lines 120 and the plurality of lower crystalline oxide semiconductor layers 12 is formed. A stack structure of the first interlayer insulating layer 110A and the second interlayer insulating layer 110B may be referred to as the interlayer insulating layer 110. The second interlayer insulating layer 110B may be formed to be positioned at the same vertical level as that of upper surfaces of the plurality of lower crystalline oxide semiconductor layers 12.

Figure 6A:
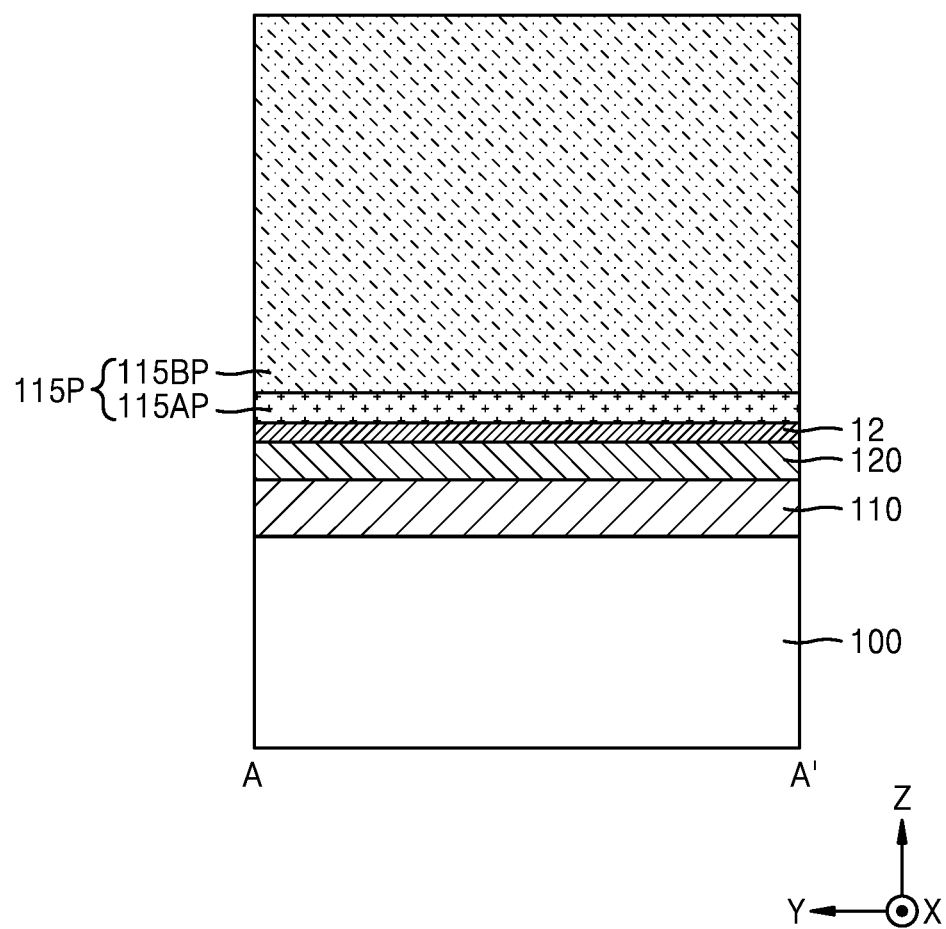
Figure 6B:
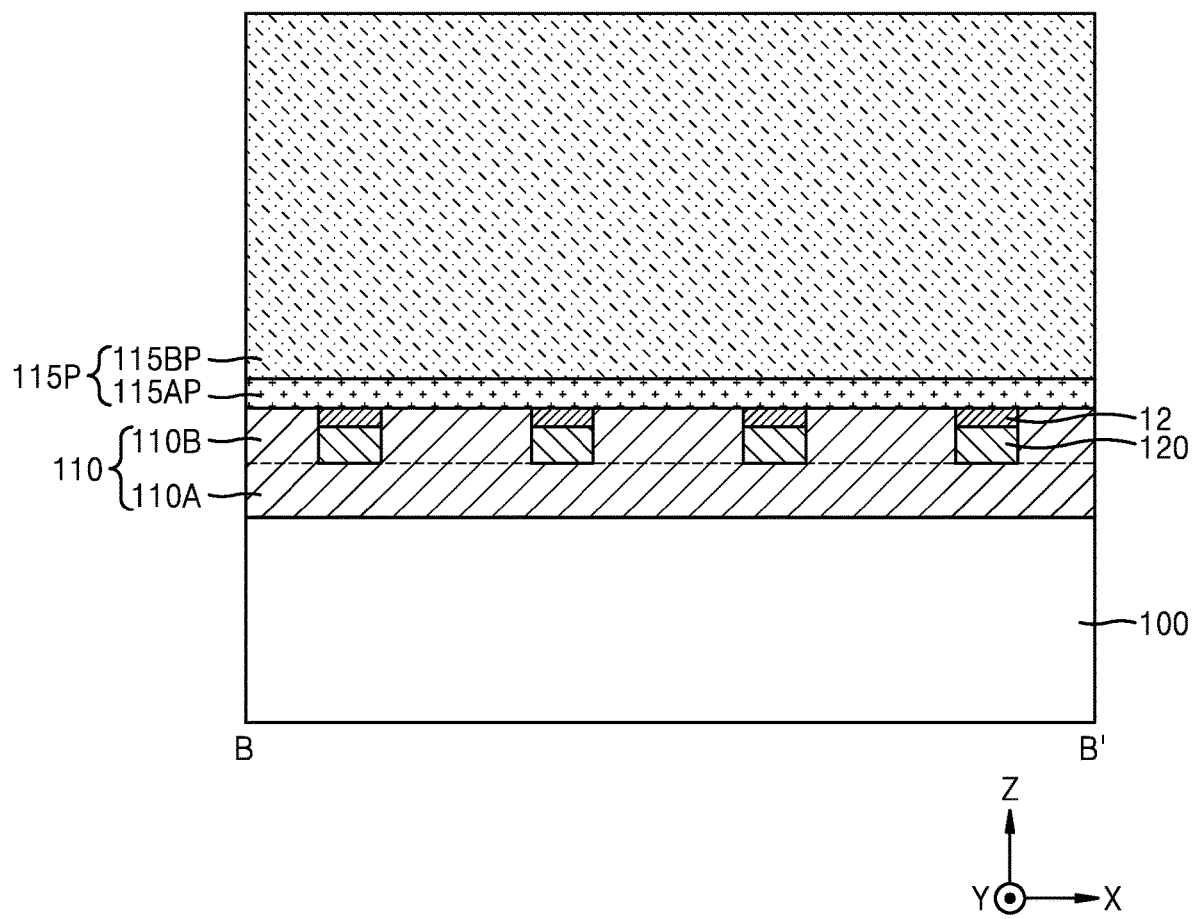

Referring to FIGS. 6A and 6B together, a preliminary isolation insulating layer 115P is formed above the plurality of lower crystalline oxide semiconductor layers 12 and the interlayer insulating layer 110. The preliminary isolation insulating layer 115P may be formed to have a stack structure of a preliminary lower isolation insulating layer 115AP and a preliminary upper isolation insulating layer 115BP. In some embodiments, the preliminary lower isolation insulating layer 115AP may be formed to include nitride, and the preliminary upper isolation insulating layer 115BP may be formed to include oxide.

Referring to FIGS. 6A, 6B, 7A, and 7B together, a plurality of isolation insulating layers 115 are formed by patterning the preliminary isolation insulating layer 115P. Each of the plurality of isolation insulating layers 115 may have a stack structure of the lower isolation insulating layer 115A and the upper isolation insulating layer 115B. The plurality of separation layers 115 may extend in the first horizontal direction (X direction) and may be formed to be spaced apart from each other at equal intervals in the second horizontal direction (Y direction). The channel trench 115t extending long in the first horizontal direction (X direction) may be formed between the plurality of isolation insulating layers 115.

Figure 7A:
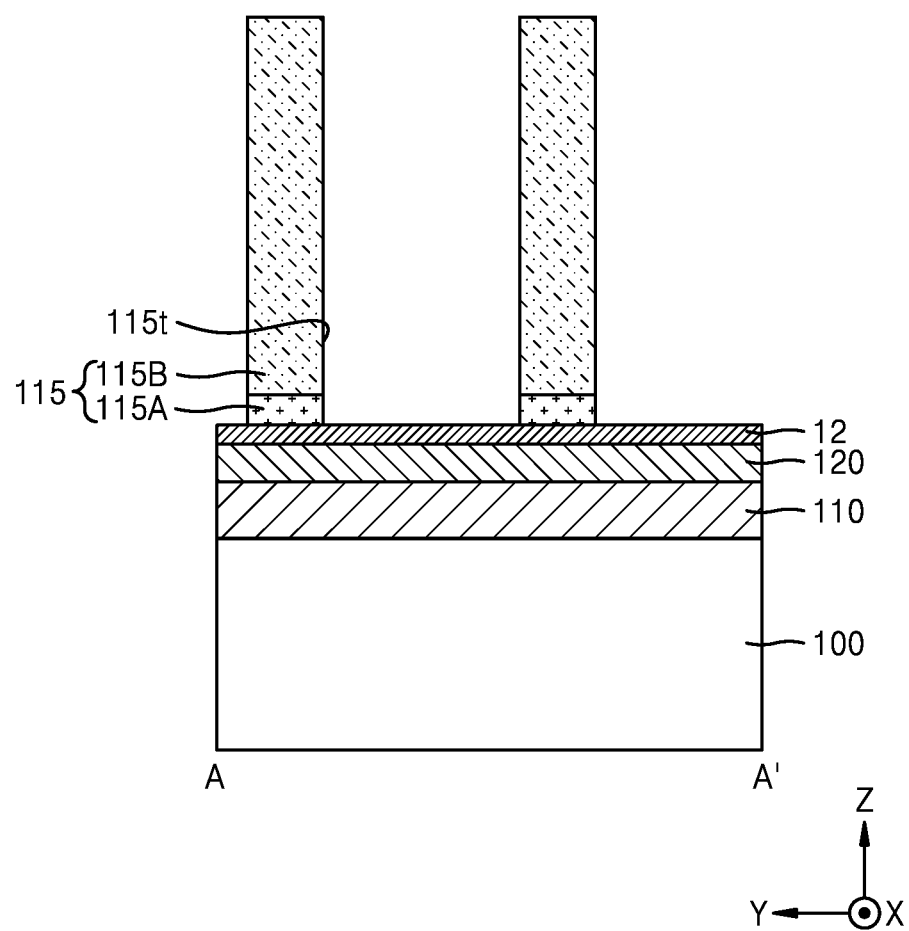
Figure 7B:
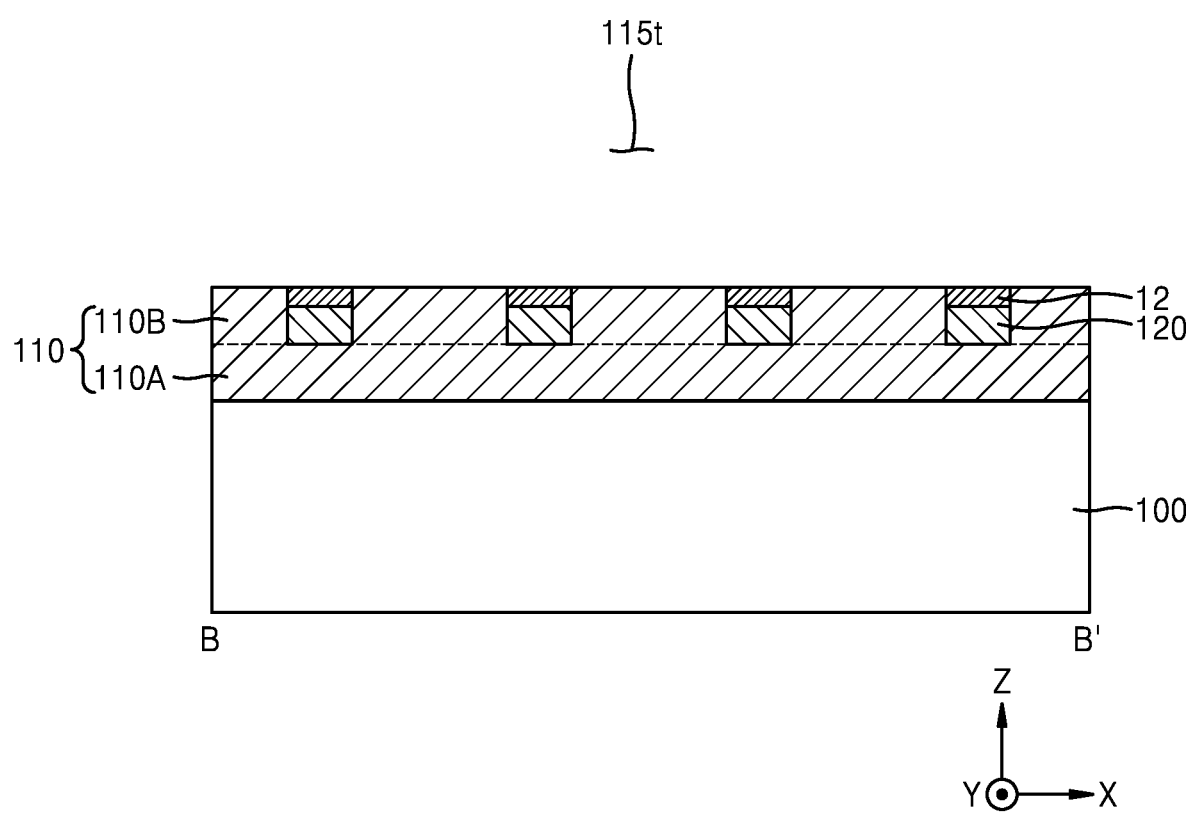
Figure 8A:
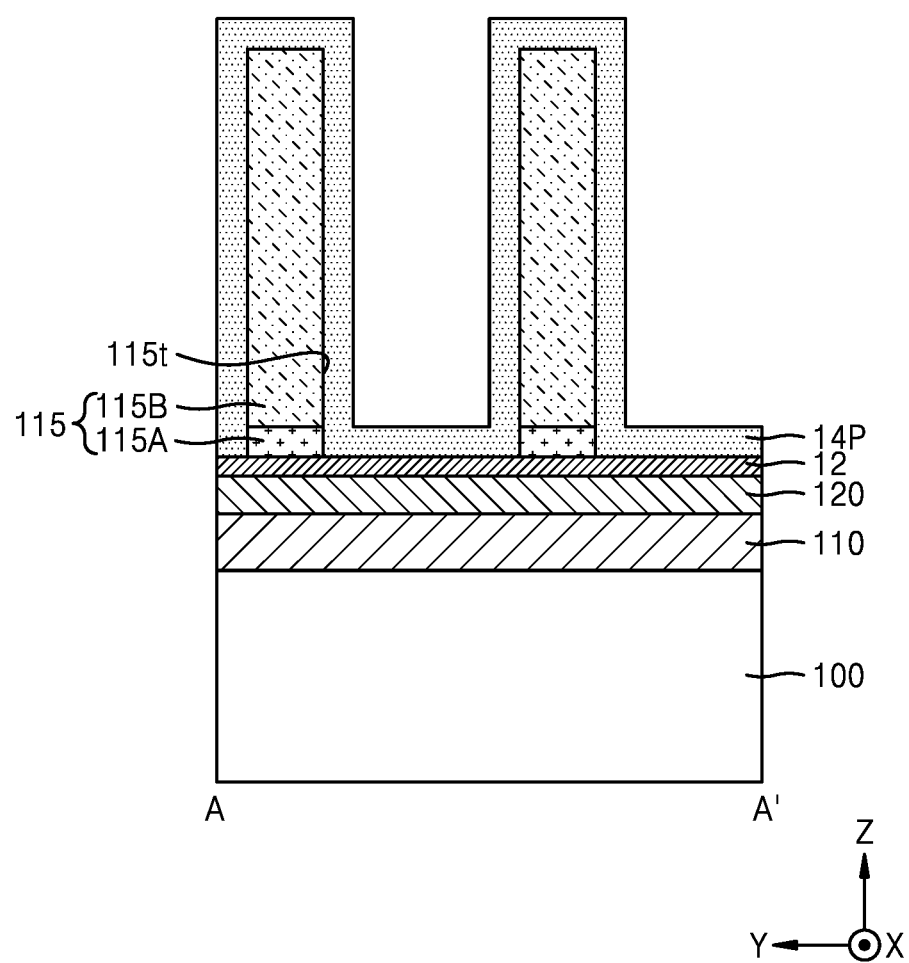
Figure 8B:
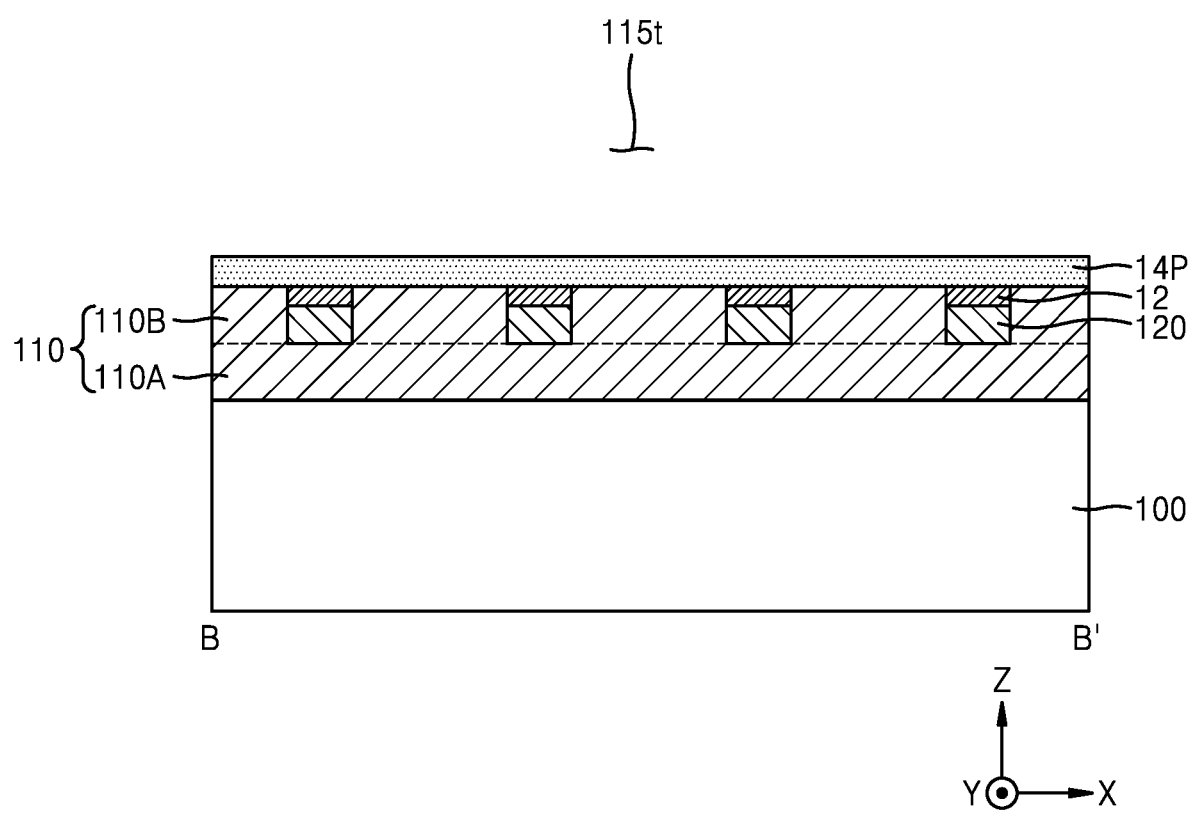

Referring to FIGS. 8A and 8B together, a preliminary amorphous oxide semiconductor layer 14P covering a surface of a resultant of FIGS. 7A and 7B is formed. The preliminary amorphous oxide semiconductor layer 14P may be formed to conformally cover upper surfaces and side surfaces of the plurality of isolation insulating layers 115, upper surfaces of the plurality of lower crystalline oxide semiconductor layers 12, and the upper surface of the interlayer insulating layers 110 positioned on the bottom surface of the channel trench 115t.

Figure 9A:
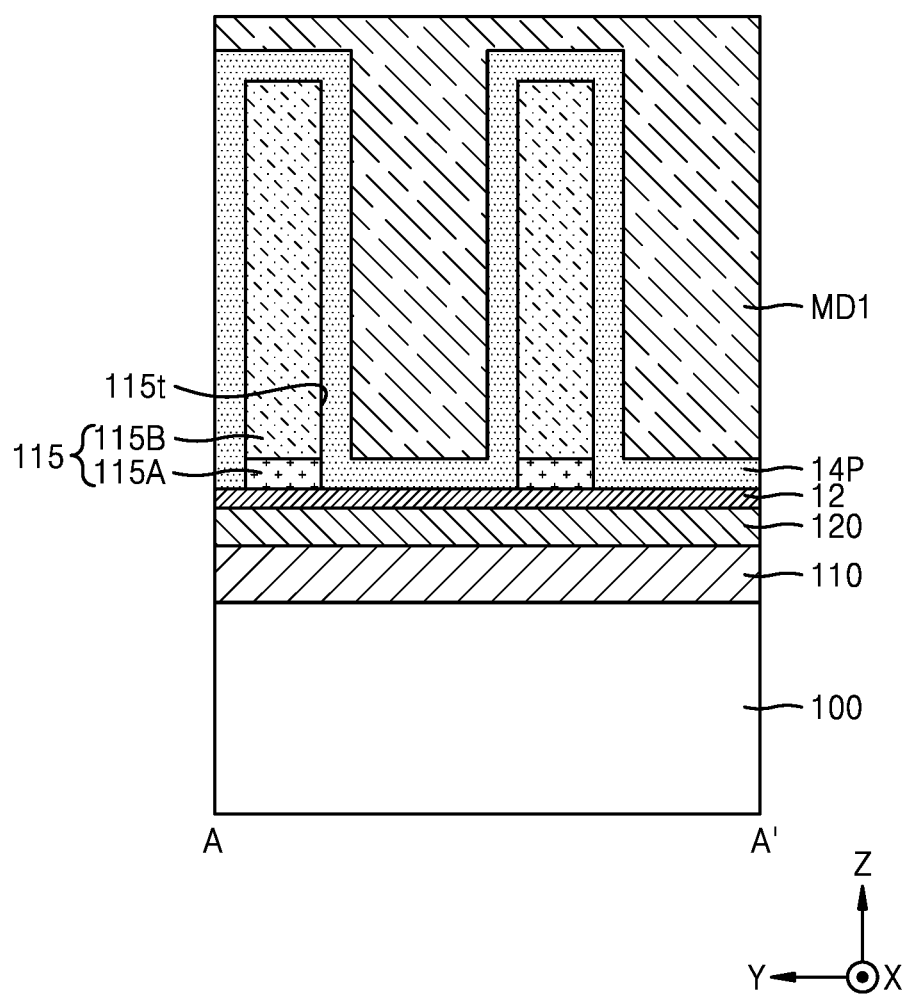
Figure 9B:
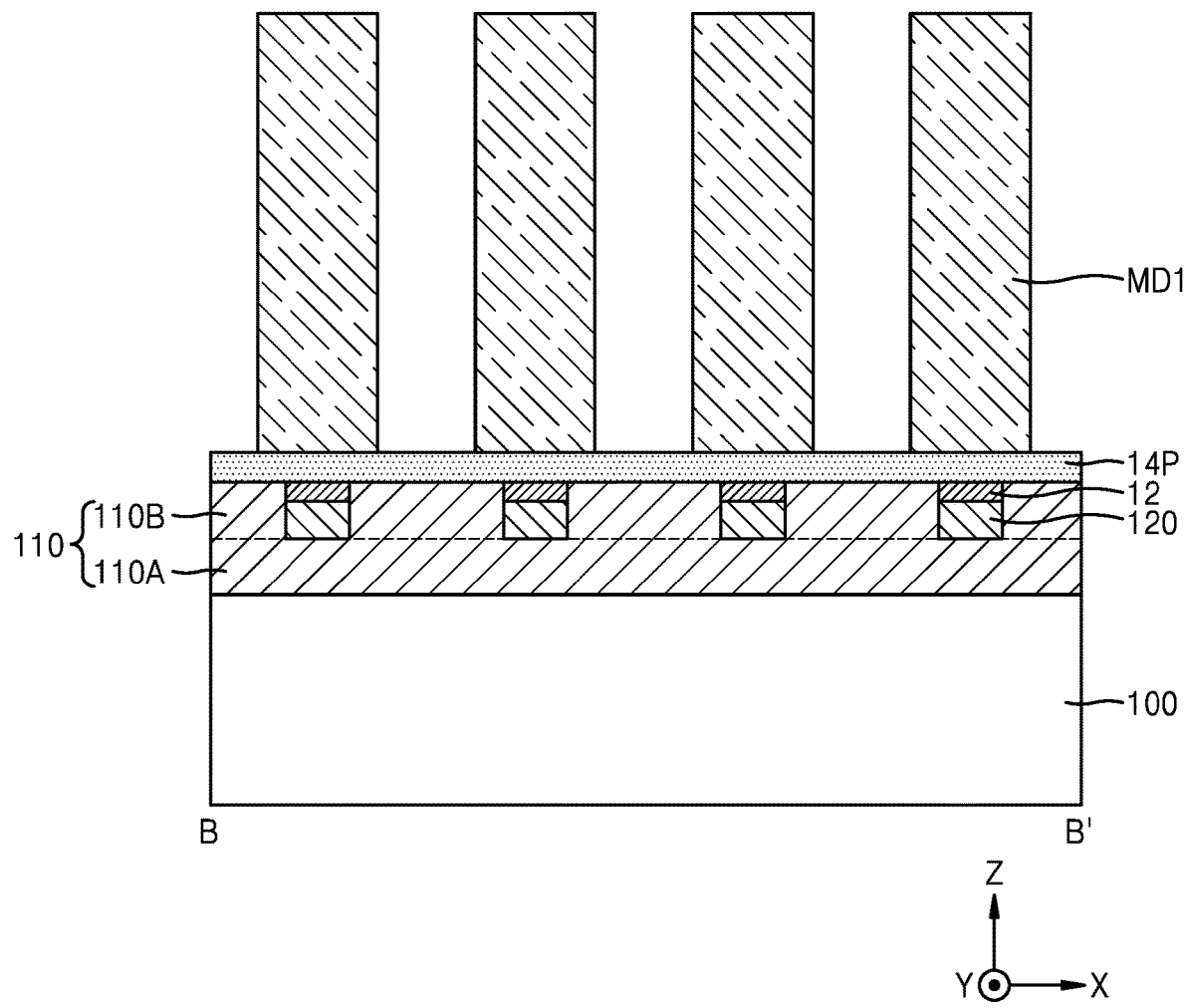
Figure 10A:
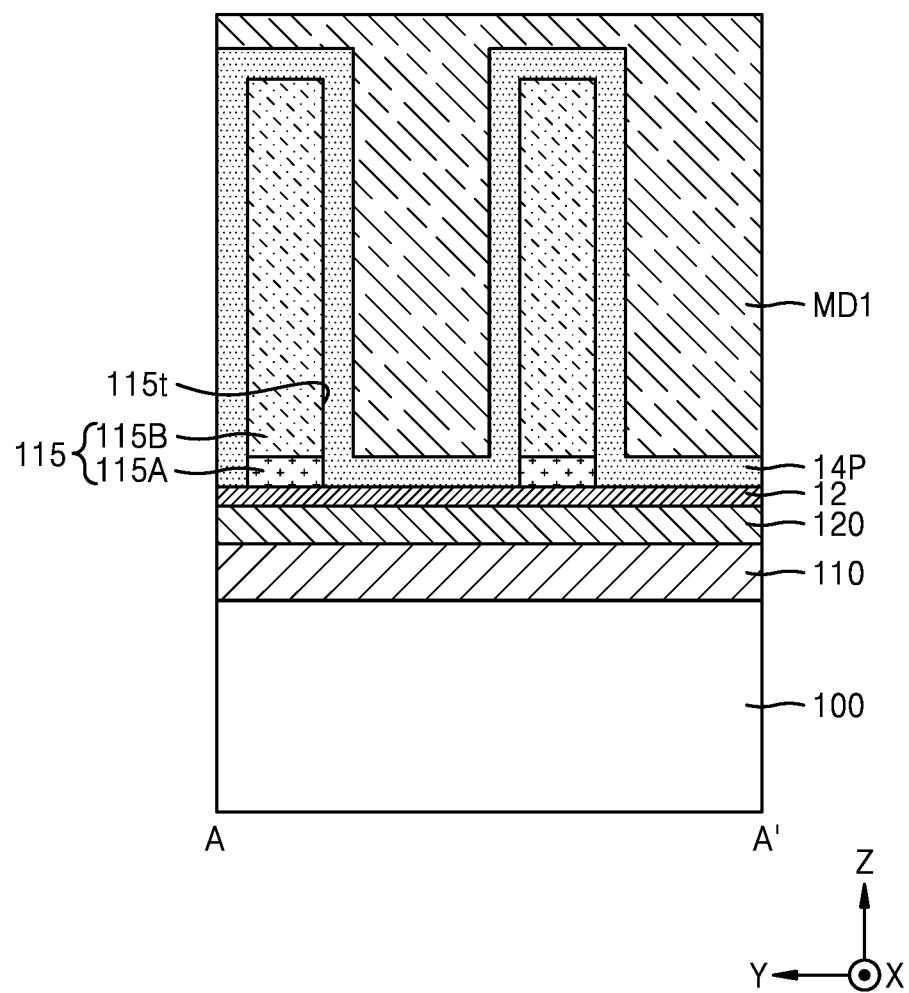
Figure 10B:
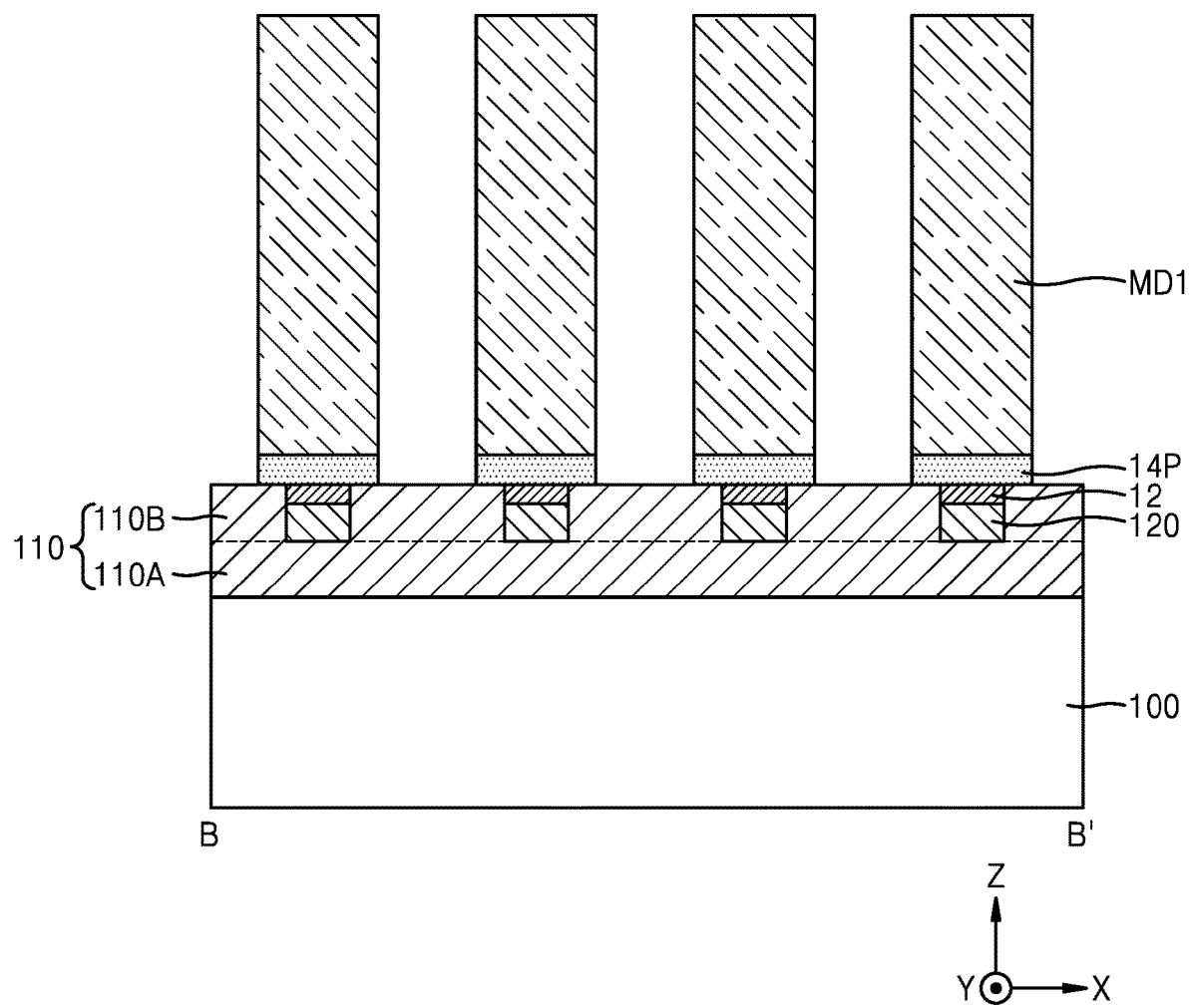

Referring to FIGS. 9A and 9B, a plurality of first mold layers MD1 are formed to cover the preliminary amorphous oxide semiconductor layer 14P and to fill a part of the channel trench 115t. The plurality of first mold layers MD1 may extend long in the second horizontal direction (Y direction). The plurality of first mold layers MD1 may be formed by forming a preliminary mold layer covering the preliminary amorphous oxide semiconductor layer 14P and filling the channel trench 115t, and then patterning the preliminary mold layer.

Referring to FIGS. 9A, 9B, 10A, and 10B together, parts of the upper surface of the interlayer insulating layer 110 are exposed by removing a part of the preliminary amorphous oxide semiconductor layer 14P by using the plurality of first mold layers MD1 as an etch mask.

Figure 11A:
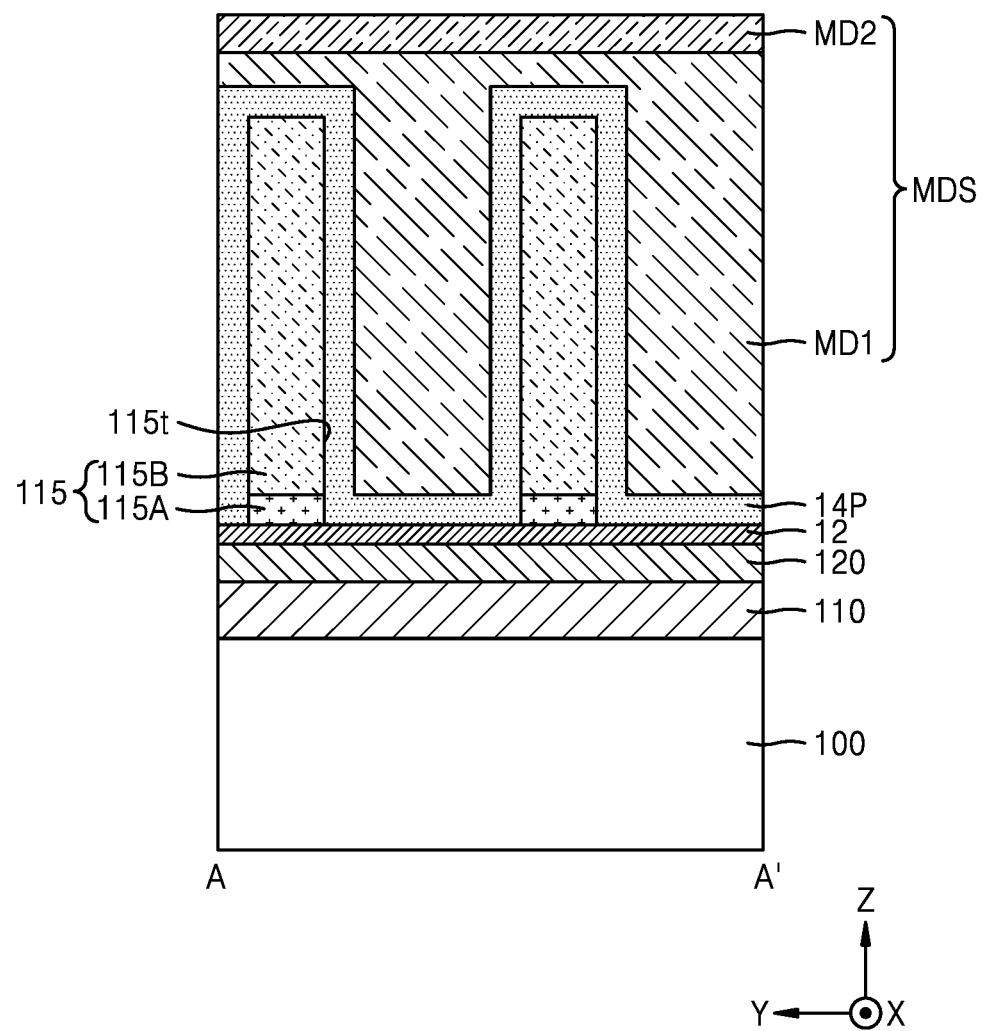
Figure 11B:
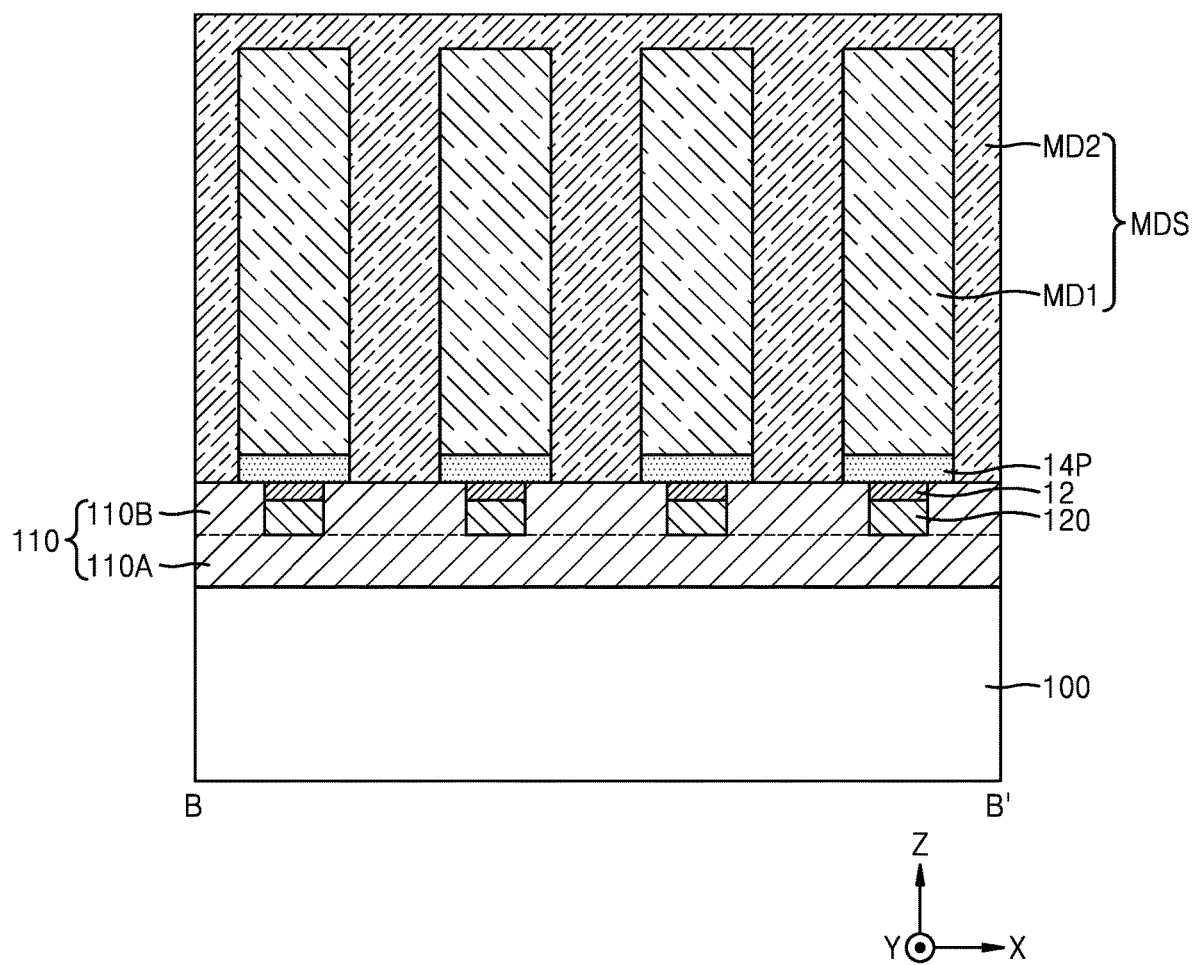
Figure 12A:
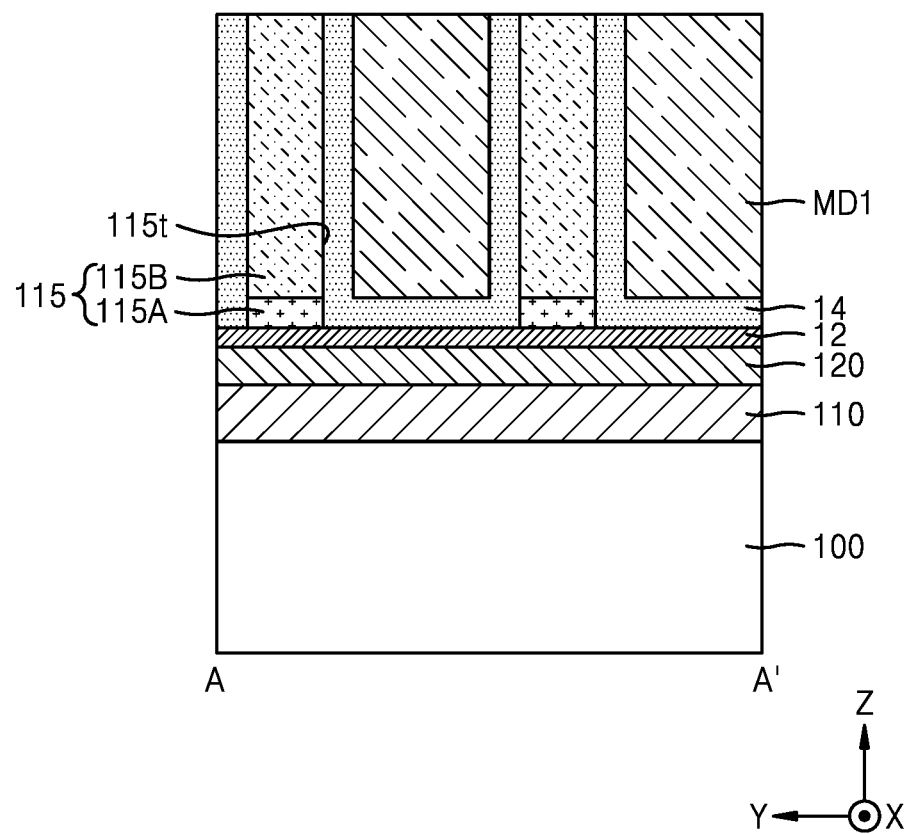
Figure 12B:
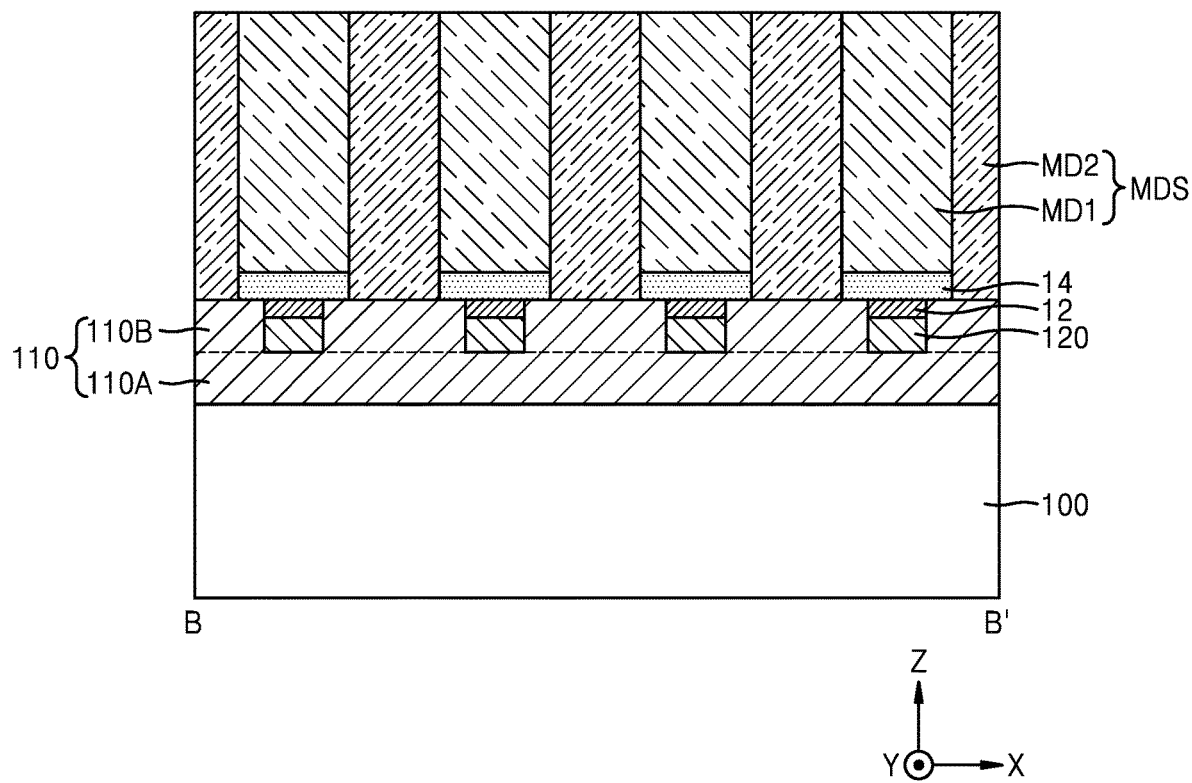
Figure 13A:
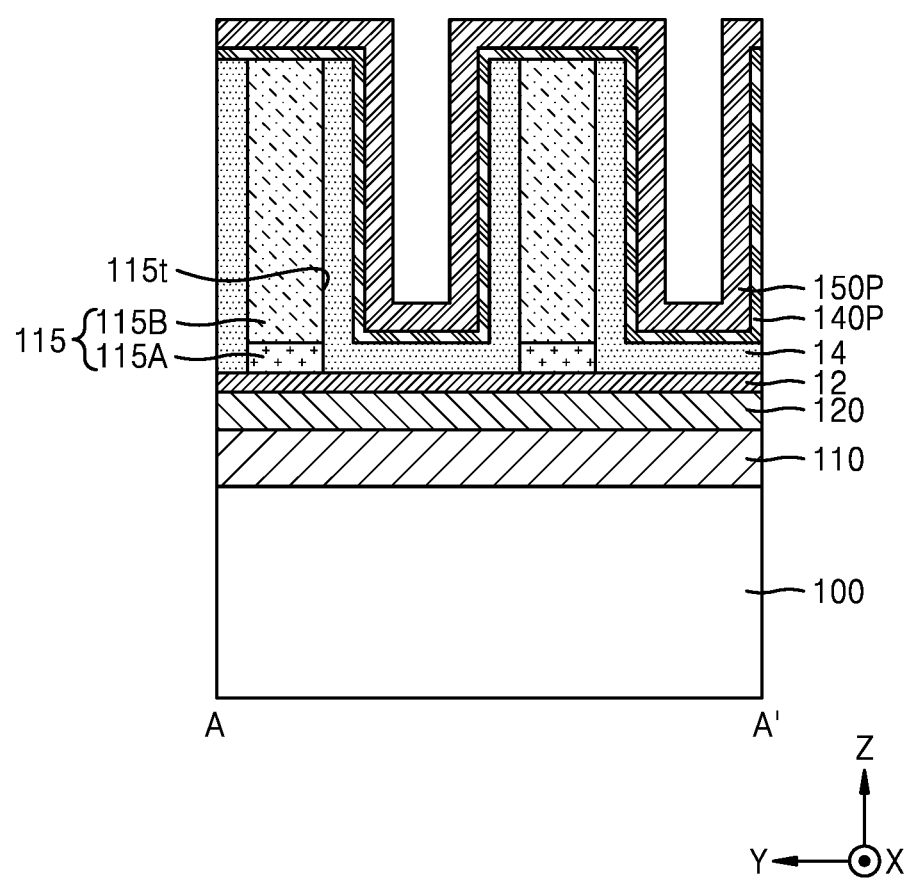
Figure 13B:
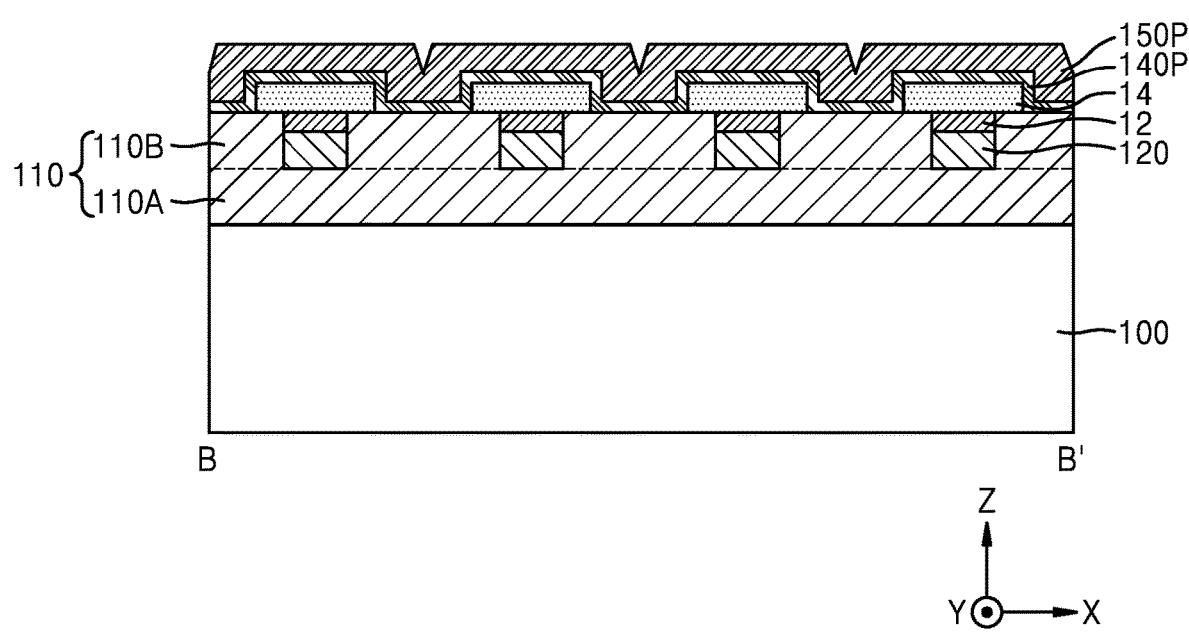
Figure 14A:
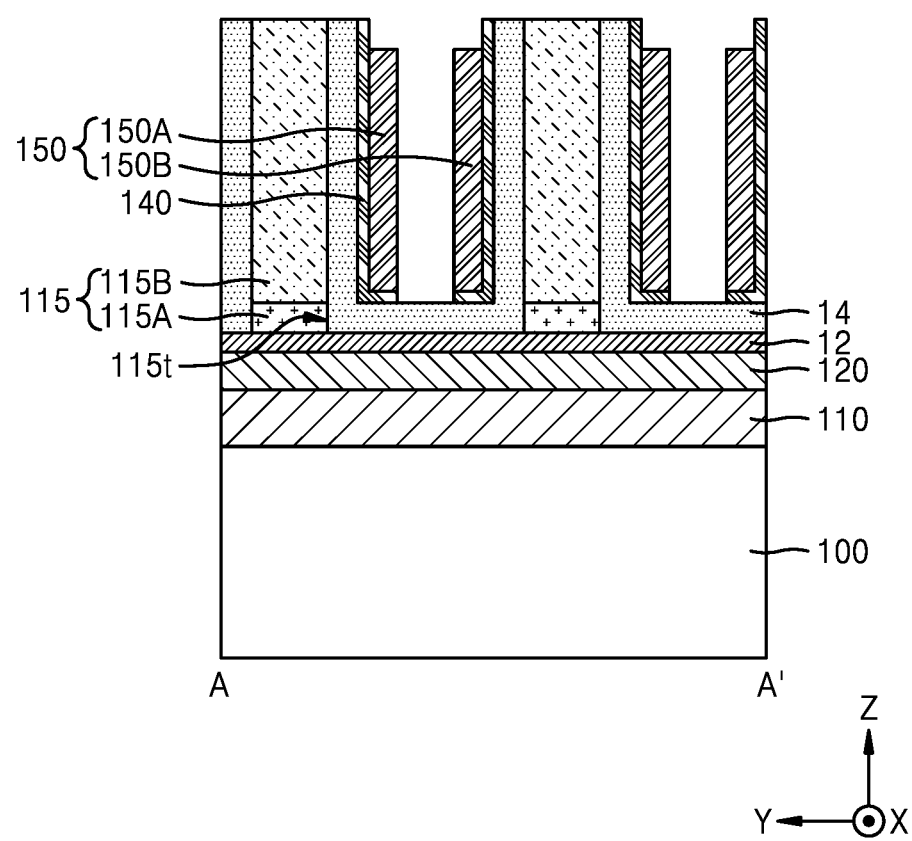
Figure 14B:
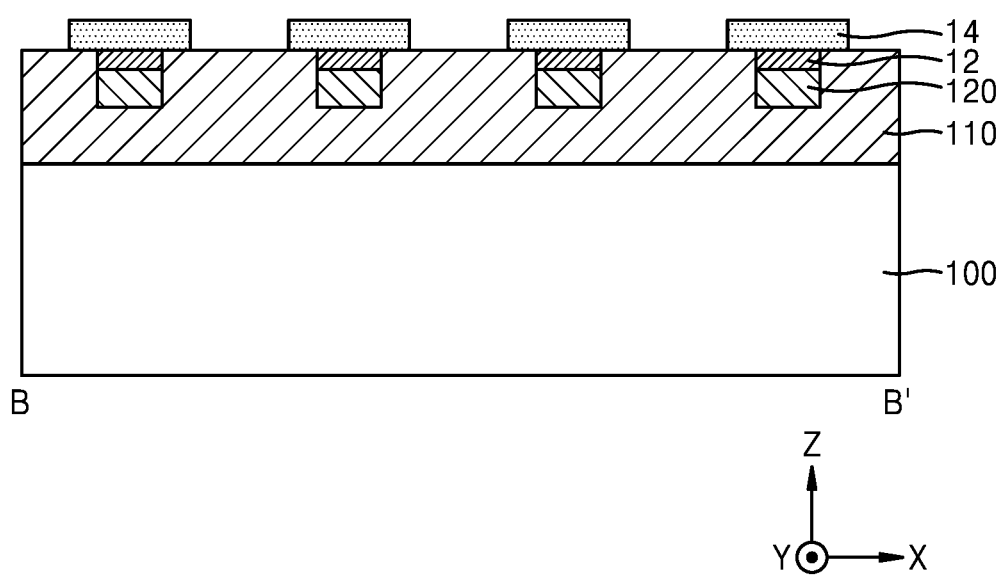

Referring to FIGS. 11A and 11B together, a second mold layer MD2 filling space between the plurality of first mold layers MD1 and covering upper surfaces of the plurality of first mold layers MD1 is formed. A stack structure of the plurality of first and second mold layers MD1 and MD2 may be referred to as a mold structure MDS.

Referring to FIGS. 11A, 11B, 12A, and 12B together, a plurality of amorphous oxide semiconductor layers 14 are formed by removing a part of the upper side of the mold structure MDS and a part of the preliminary amorphous oxide semiconductor layer 14P covering the upper surfaces of the plurality of isolation insulating layers 115. Each of the plurality of amorphous oxide semiconductor layers 14 may be formed to cover the inner surface and the bottom surface of the channel trench 115t and to have a U-shaped vertical cross-section.

Referring to FIGS. 12A, 12B, 13A, and 13B together, after removing the mold structure MDS, a preliminary gate dielectric layer 140P conformally covering the upper surface of the plurality of isolation insulating layers 115 and the upper surface and side surfaces of the plurality of amorphous oxide semiconductor layers 14 and a preliminary gate electrode 150P are sequentially formed. The preliminary gate dielectric layer 140P and the preliminary gate electrode 150P may be formed to fill only a part of the channel trench 115t.

Referring to FIGS. 13A, 13B, 14A and 14B together, after removing part of the preliminary gate dielectric layer 140P and part of the preliminary gate electrode 150P covering the upper surfaces of the plurality of isolation insulating layers 115 and the upper surfaces of the plurality of amorphous oxide semiconductor layers 14, and, the gate dielectric layer 140 and the gate electrode 150 are formed by removing a part of the preliminary gate electrode 150P covering a part of the upper side of the side surfaces of the plurality of isolation insulating layers 115 and a part of the preliminary gate electrode 150P covering the bottom surface of the channel trench 115t.

For example, after forming a third mold layer filling the channel trench 115t and covering the preliminary gate electrode 150P, parts of the upper side of the third mold layer, part of the preliminary gate dielectric layer 140P, and parts of the preliminary gate electrode 150P covering the upper surfaces of the plurality of isolation insulating layers 115 and the upper surfaces of the plurality of amorphous oxide semiconductor layers 14 are removed. Thereafter, after removing the third mold layer, the gate dielectric layer 140 and the gate electrode 150 may be formed by performing anisotropic etching on the preliminary gate electrode 150P, which remains.

The gate dielectric layer 140 may be formed to cover side surfaces of the amorphous oxide semiconductor layer 14 and extend in the vertical direction (Z direction) in the channel trench 115t, and the gate electrode 150 may be formed to cover the gate dielectric layer 140 and extend in the vertical direction (Z direction) in the channel trench 115t.

In some embodiments, the gate electrode 150 may be formed to include the first gate electrode 150A and the second gate electrode 150B that face each other in one channel trench 115t. The first gate electrode 150A and the second gate electrode 150B may be spaced apart from each other in the second horizontal direction (Y direction) and extend long in the first horizontal direction (X direction).

Figure 15A:
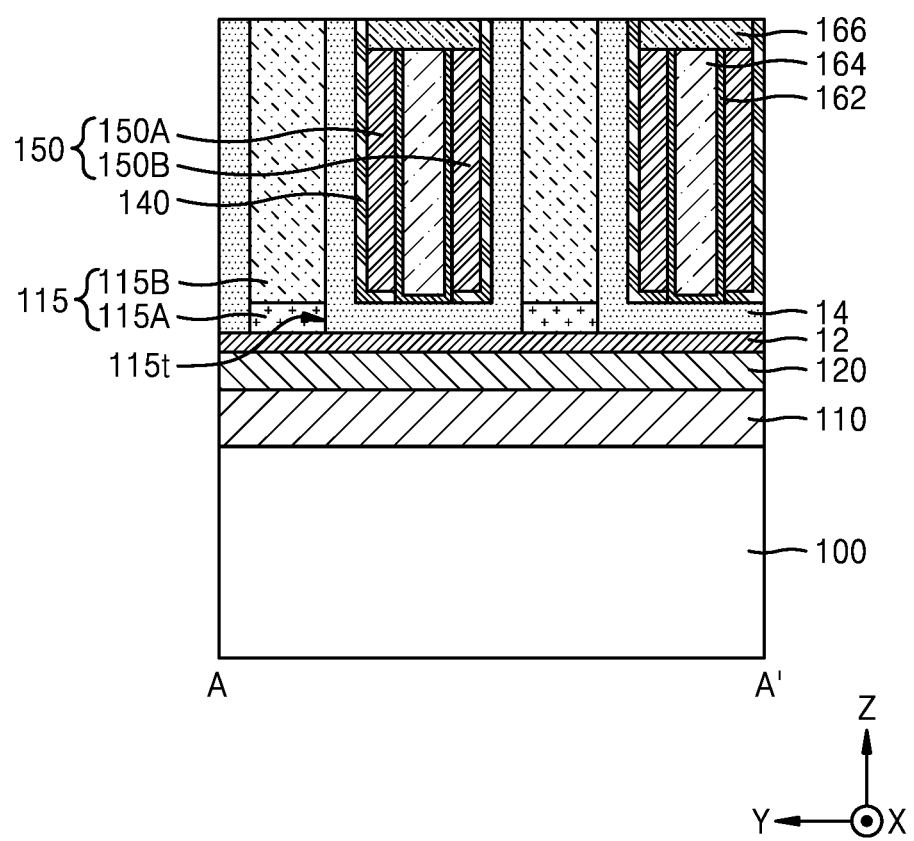
Figure 15B:
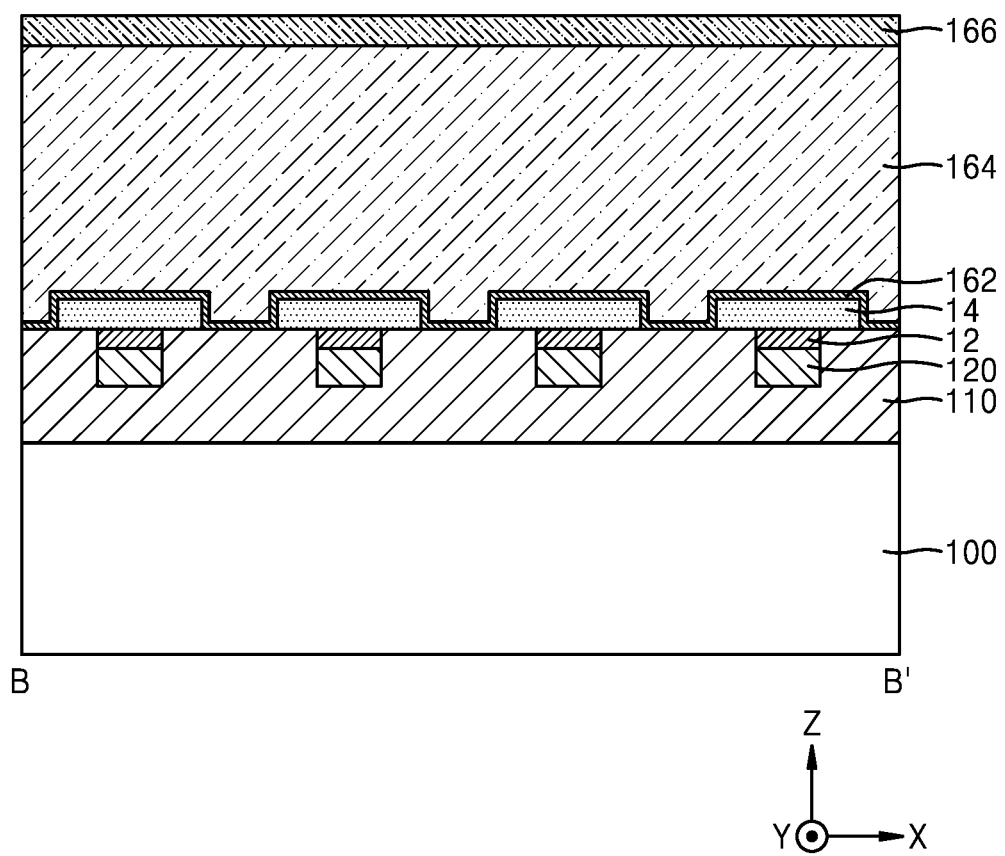

Referring to FIGS. 15A and 15B together, a barrier insulating layer 162 conformally covering above the gate electrode 150 and the amorphous oxide semiconductor layer 14 in the channel trench 115t, a gap-fill insulating layer 164 covering the barrier insulating layer 162 to fill space defined by the barrier insulating layer 162 in the channel trench 115t, and a gate capping pattern 166 covering the upper surface of the gate electrode 150, the upper surface of the barrier insulating layer 162, and the upper surface of the gap-fill insulating layer 164 are sequentially formed.

Figure 16:
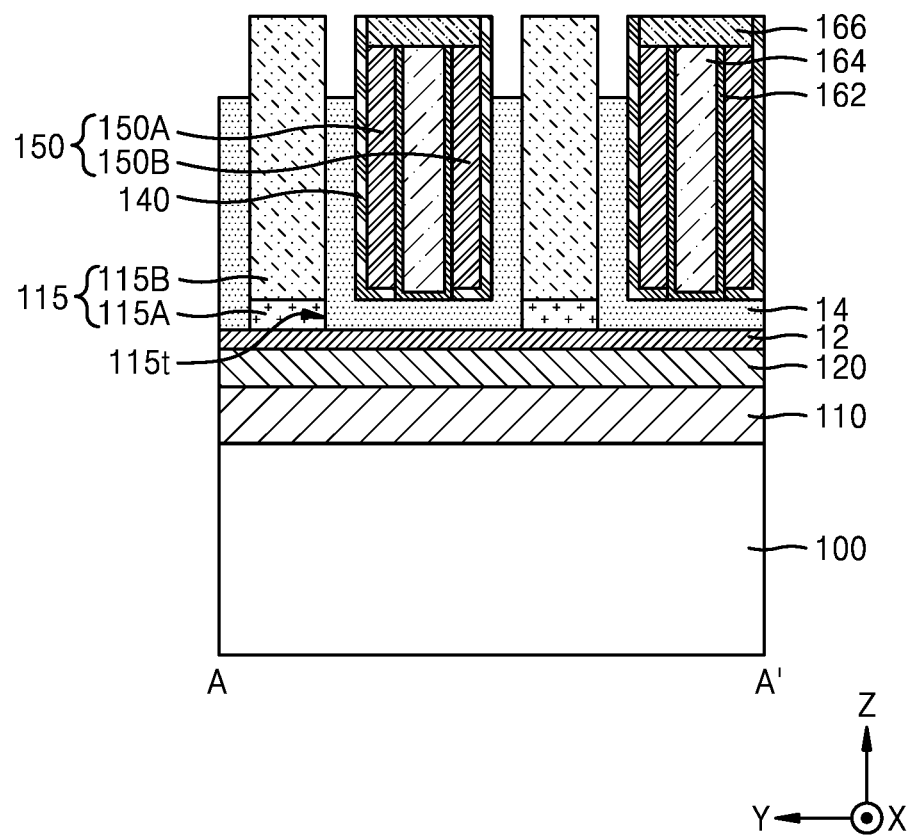

Referring to FIGS. 15A, 15B, and 16 together, a part of the upper side of the amorphous oxide semiconductor layer 14 is removed. The uppermost end of the amorphous oxide semiconductor layer 14 may be positioned at a lower vertical level than that of the uppermost end of the gate electrode 150, by removing the part of the upper side of the amorphous oxide semiconductor layer 14.

Figure 17:
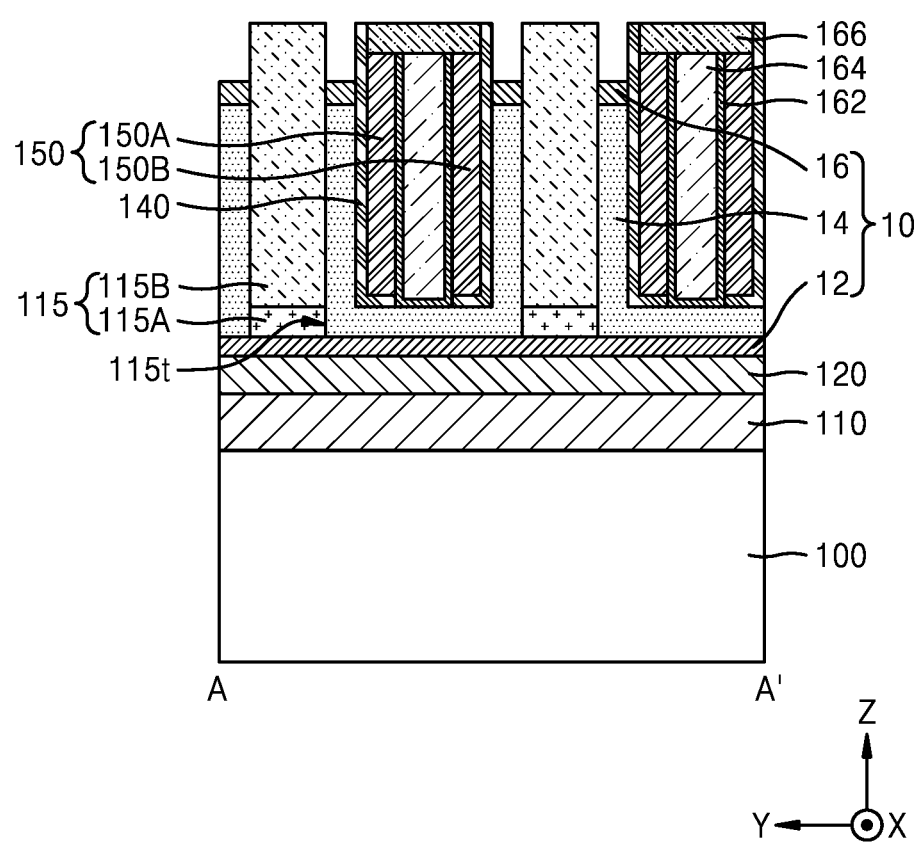

Referring to FIG. 17, the upper crystalline oxide semiconductor layer 16 is formed above the upper surface of the amorphous oxide semiconductor layer 14. The lower crystalline oxide semiconductor layer 12, the amorphous oxide semiconductor layer 14, and the upper crystalline oxide semiconductor layer 16 may constitute the channel structure 10. The upper crystalline oxide semiconductor layer 16 may be formed to fill a part of a lower side of space from which the part of the upper side of the amorphous oxide semiconductor layer 14 described with reference to FIG. 16 is removed, that is, space defined between the isolation insulating layer 115 and the gate dielectric layer 140. An amorphous oxide semiconductor material may be transformed into a crystalline oxide semiconductor material by adjusting temperature. Accordingly, each of the lower crystalline oxide semiconductor layer 12, the amorphous oxide semiconductor layer 14, and the upper crystalline oxide semiconductor layer 16 may be formed by a simple process step. For example, each of the lower crystalline oxide semiconductor layer 12, the amorphous oxide semiconductor layer 14, and the upper crystalline oxide semiconductor layer 16 may be formed only by a deposition process, and thus the process margin, process steps, or manufacturing cost may be enhanced.

In some embodiments, the upper crystalline oxide semiconductor layer 16 may be formed to have an upper surface positioned at a lower vertical level than that of the upper surface of the isolation insulating layer 115. In some embodiments, the upper crystalline oxide semiconductor layer 16 may be formed to have an upper surface at a lower vertical level than that of the upper surface of the gate electrode 150.

Figure 18A:
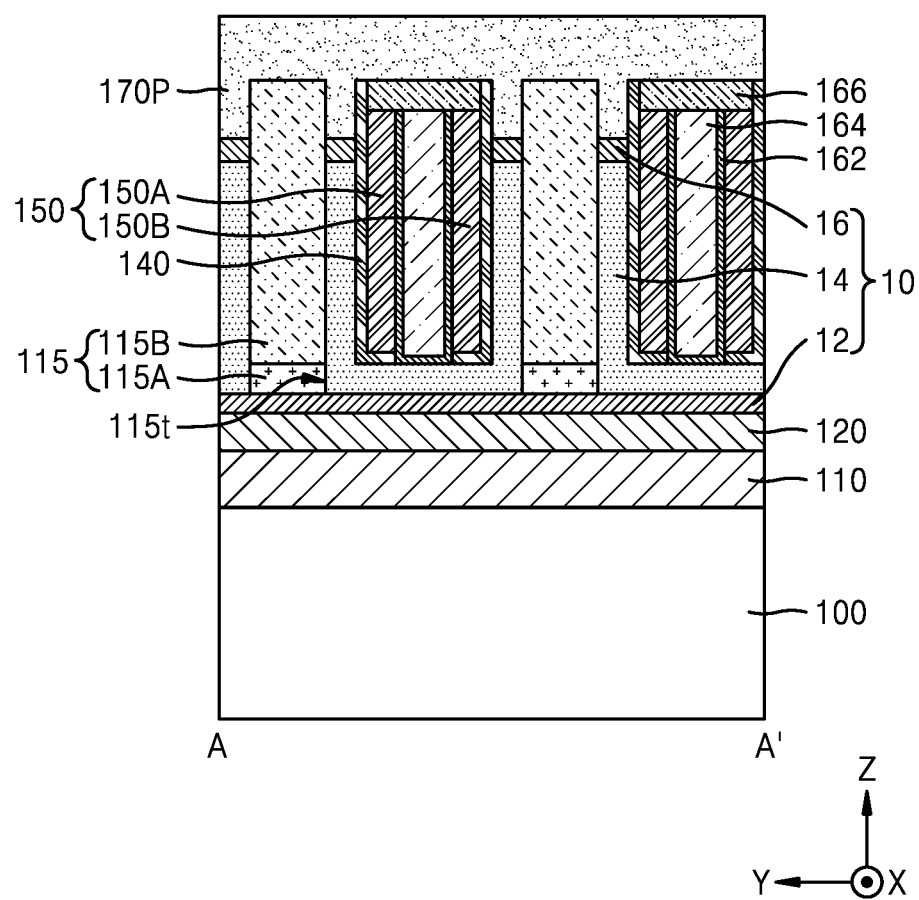
Figure 18B:
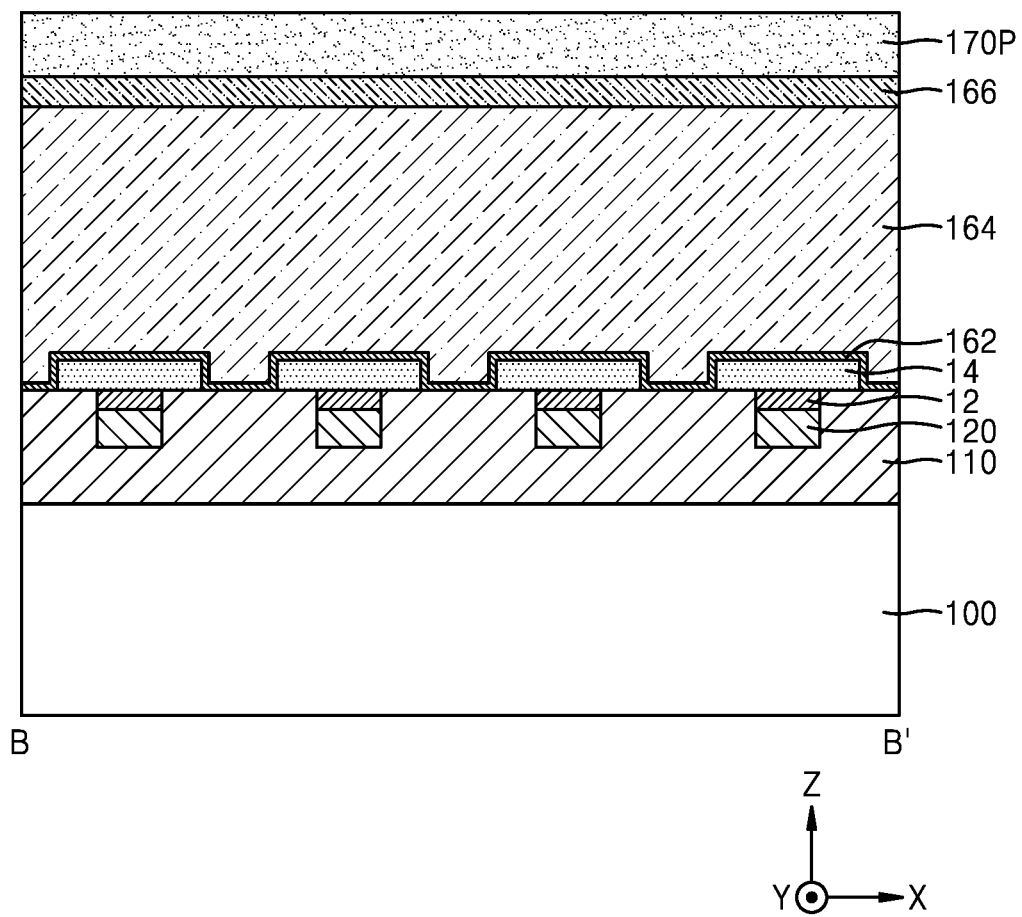

Referring to FIGS. 17, 18A, and 18B together, a contact material layer 170P covering the upper crystalline oxide semiconductor layer 16, the isolation insulating layer 115, and the gate capping pattern 166 is formed. The contact material layer 170P may be formed to fill space defined between the isolation insulating layer 115 and the gate dielectric layer 140, and to cover the upper surface of the isolation insulating layer 115 and the upper surface of the gate capping pattern 166.

Figure 19A:
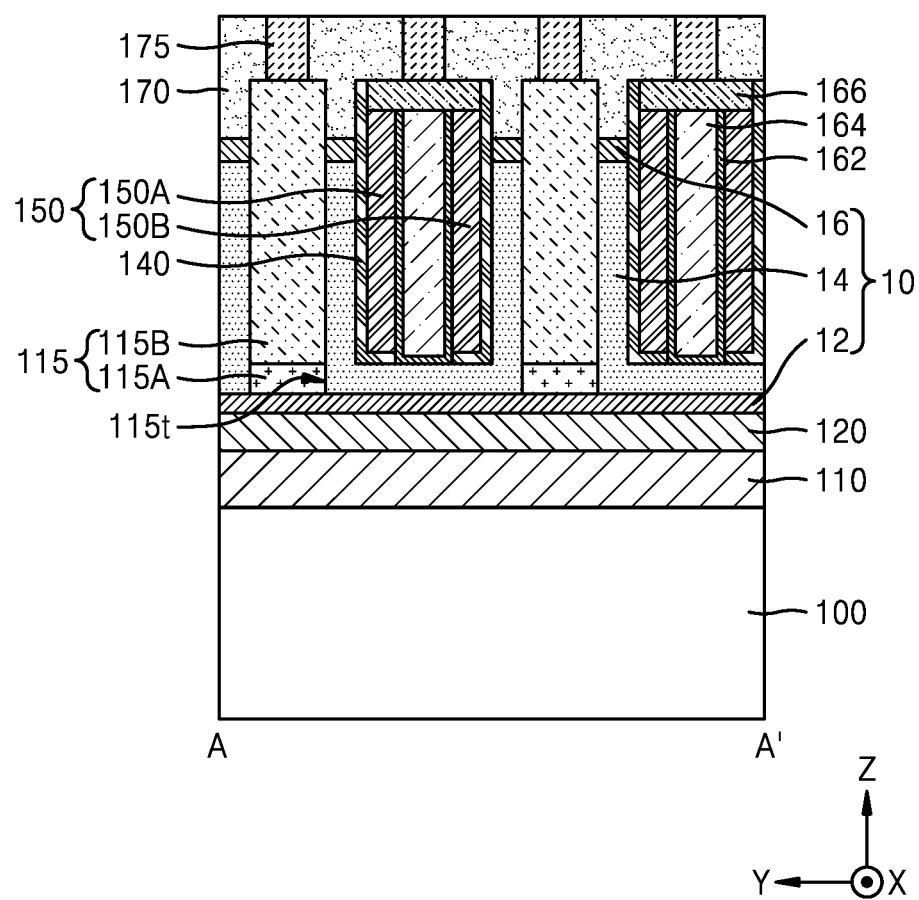
Figure 19B:
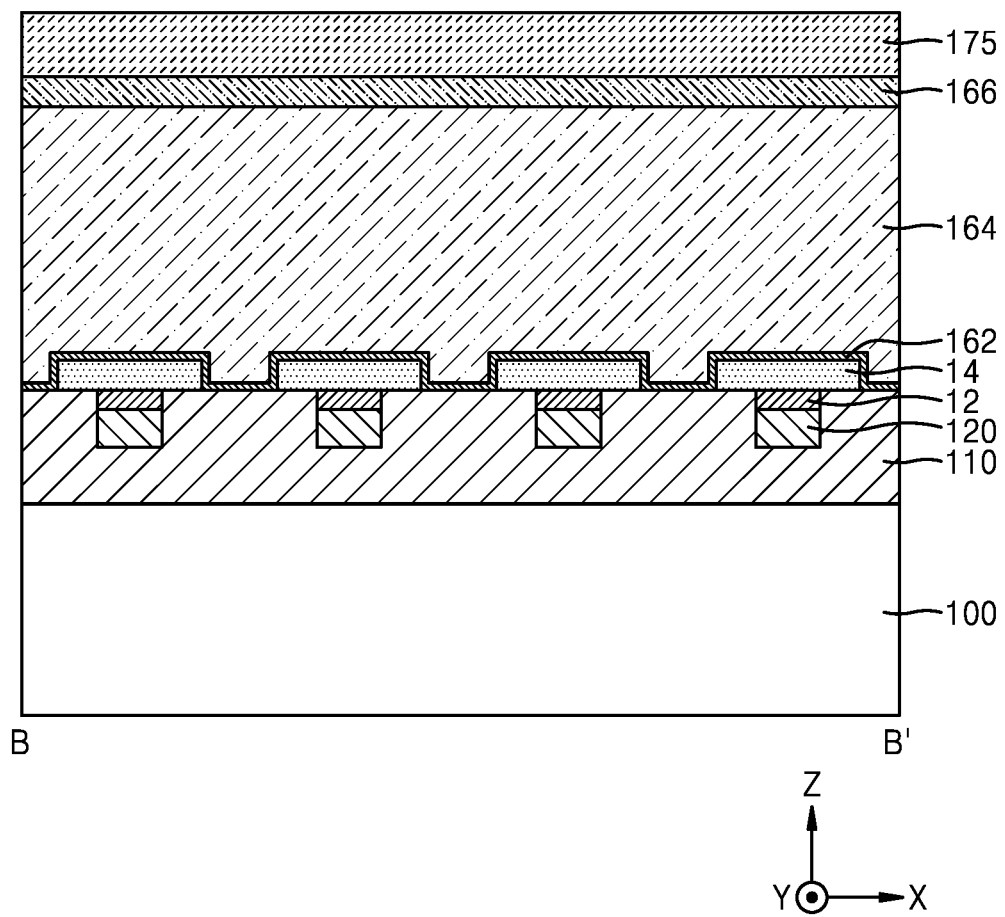

Referring to FIGS. 18A, 18B, 19A, and 19B together, after forming the plurality of contact structures 170 by removing a part of the contact material layer 170P, an insulating structure 175 filling space from which a part of the contact material layer 170P is removed, i.e., space between the plurality of contact structures 170, is formed. FIGS. 19A and 19B show that the lower surface of the insulating structure 175 is positioned at the same vertical level as that of the upper surface of the isolation insulating layer 115 and the upper surface of the gate capping pattern 166, but is not limited thereto. In some embodiments, the insulating structure 175 may be formed to extend into the isolation insulating layer 115 and the gate capping pattern 166 so that the lower surface of the insulating structure 175 is positioned at a lower vertical level than those of the upper surface of the isolation insulating layer 115 and the upper surface of the gate capping pattern 166.

Figure 20A:
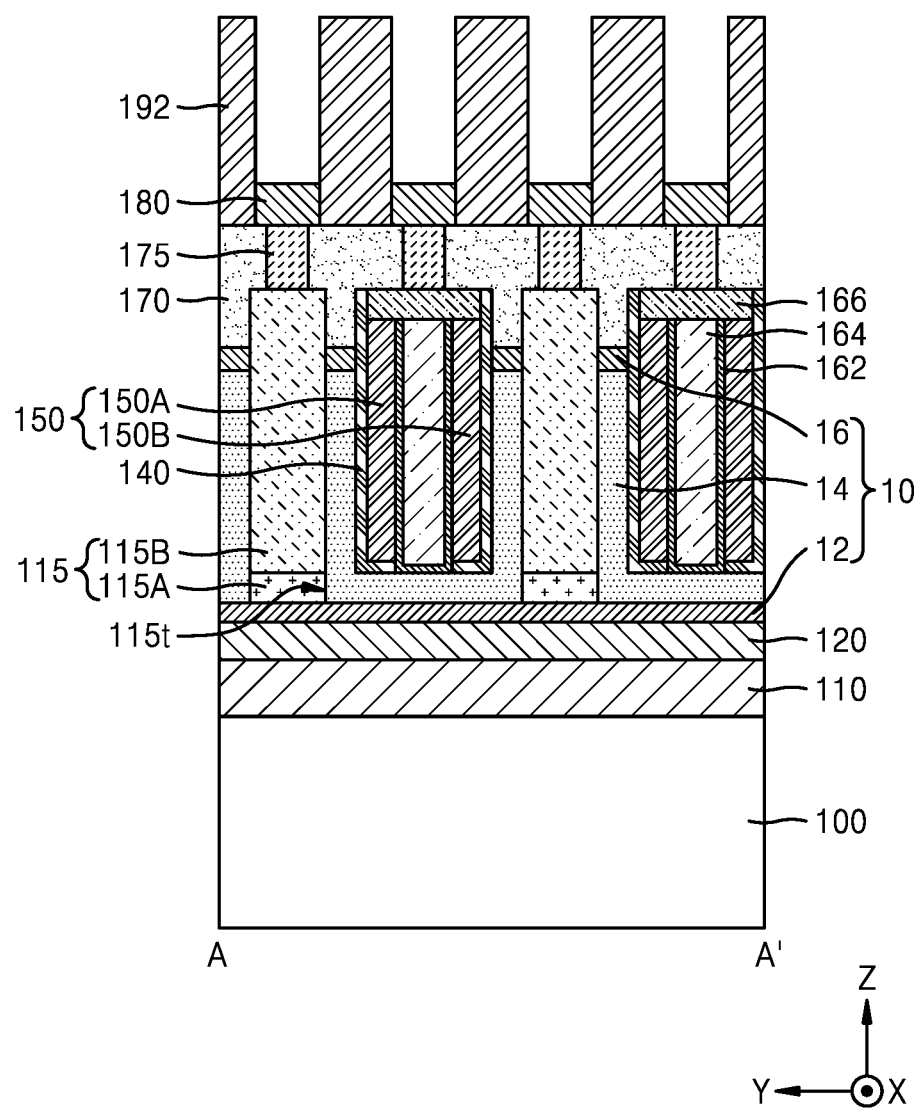
Figure 20B:
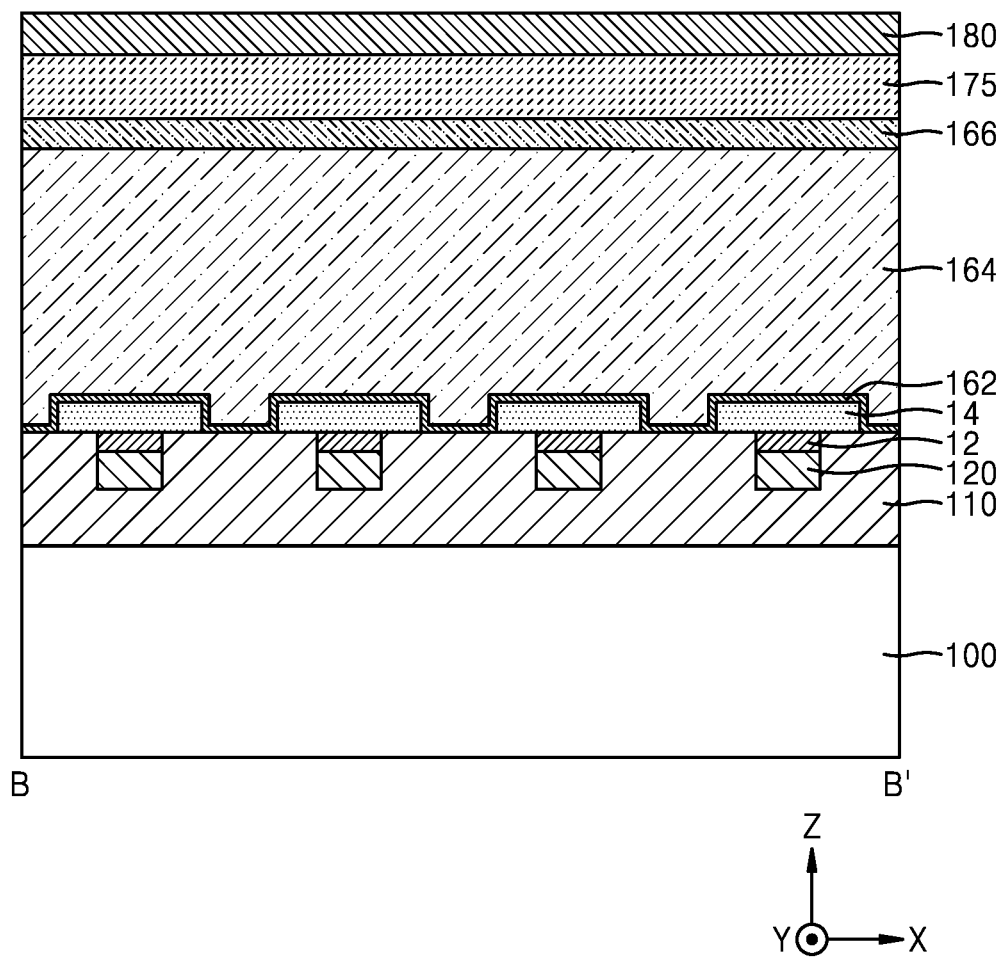

Referring to FIGS. 20A and 20B together, a support insulating layer 180 is formed above the plurality of contact structures 170 and the insulating structures 175. The support insulating layer 180 may have a plurality of holes having a bottom surface through which the plurality of contact structures 170 are exposed.

A plurality of lower electrodes 192 are respectively formed above the plurality of contact structures 170. The plurality of lower electrodes 192 may be formed to extend in the vertical direction (Z direction) from the upper surface of the contact structure 170 exposed at the bottom surfaces of the plurality of holes of the support insulating layer 180.

In FIG. 20A, the lower electrode 192 is illustrated to have a pillar shape extending from the upper surface of the contact structure 170 in the vertical direction (Z direction), but this is an example. In some other embodiments, the lower electrode 192 may be formed to have a cylindrical shape extending in the vertical direction (Z direction) from the upper surface of the contact structure 170.

Thereafter, as shown in FIGS. 2A and 2B, the capacitor dielectric layer 194 and the upper electrode 194 are sequentially formed above the plurality of lower electrodes 192, and thus, the semiconductor memory device 1 including the plurality of capacitor structures 190 may be formed. The capacitor dielectric layer 194 may be formed to conformally extend along profiles of the side surfaces and upper surfaces of the plurality of lower electrodes 192 and the upper surface of the support insulating layer 180. The upper electrode 196 may be formed to cover the capacitor dielectric layer 194.

Figure 21:
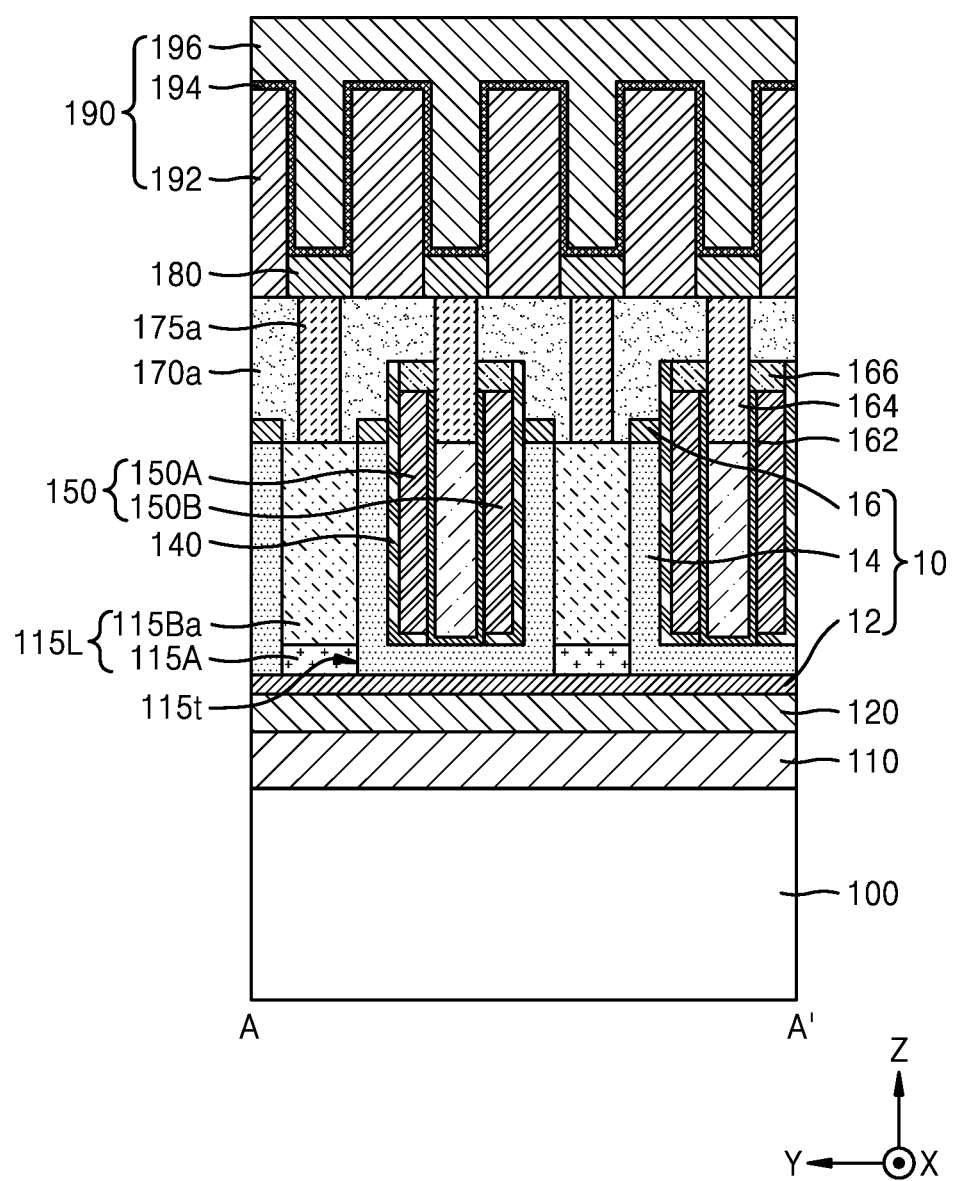
FIG. 21 is a cross-sectional view illustrating a semiconductor memory device according to example embodiments.

FIG. 21 is a cross-sectional view illustrating a semiconductor memory device 2 according to example embodiments. Specifically, FIG. 21 is a cross-sectional view taken along a part corresponding to A-A' of FIG. 1.

Referring to FIG. 21, the semiconductor memory device 2 may include the substrate 100, the interlayer insulating layer 110, the conductive line 120, an isolation insulating layer 115L, the channel structure 10, the gate dielectric layer 140, the gate electrode 150, a contact structure 170a, and the capacitor structure 190. The substrate 100, the interlayer insulating layer 110, the conductive line 120, the channel structure 10, the gate dielectric layer 140, the gate electrode 150, and the capacitor structure 190 included in the semiconductor memory device 2 are substantially the same as substrate 100, the interlayer insulating layer 110, the conductive line 120, the channel structure 10, the gate dielectric layer 140, the gate electrode 150, and the capacitor structure 190 described with reference to FIGS. 1, 2A, and 2B, respectively, and thus, descriptions redundant with those given with reference to FIGS. 1, 2A, and 2B may be omitted.

The isolation insulating layer 115L may have a stack structure of the lower isolation insulating layer 115A and an upper isolation insulating layer 115Ba. In some embodiments, the lower isolation insulating layer 115A may include nitride, and the upper isolation insulating layer 115Ba may include oxide.

The upper surface of the isolation insulating layer 115L, that is, the upper surface of the upper isolation insulating layer 115Ba, may be positioned at a lower vertical level than that of the uppermost end of the gate electrode 150. In some embodiments, the upper surface of the isolation insulating layer 115L, that is, the upper surface of the upper isolation insulating layer 115Ba, may be positioned at the same vertical level as that of the uppermost end of the amorphous oxide semiconductor layer 14, but is not limited thereto. In some other embodiments, in some embodiments, the upper surface of the isolation insulating layer 115L, that is, the upper surface of the upper isolation insulating layer 115Ba, may be positioned at the same vertical level as that of the uppermost end of the upper crystalline oxide semiconductor layer 16.

The contact structure 170a may be formed above the channel structure 10. In some embodiments, the contact structure 170a may be connected to the upper surface and side surfaces of the upper crystalline oxide semiconductor layer 16. In some other embodiments, the contact structure 170a may be connected to the upper surface of the upper crystalline oxide semiconductor layer 16. The contact structure 170a may connect the channel structure 10 to the capacitor structure 190. The contact structure 170a may include at least one conductive material, for example, metal, conductive metal nitride, conductive metal carbonitride, conductive metal carbide, metal silicide, a doped semiconductor material, conductive metal oxynitride, conductive metal oxide, or a 2D material, but is not limited thereto.

The contact structure 170a may include a plurality of contact structures 170a separated by an insulating structure 175a. The insulating structure 175a may cover above the isolation insulating layer 115L and the gate capping pattern 166, and have a plurality of recesses through which the channel structure 10 is exposed in bottom surfaces, and the plurality of contact structures 170 may fill the plurality of recesses. The insulating structure 175a may include nitride. In FIG. 21, the upper surface of the insulating structure 175a and upper surfaces of the plurality of contact structures 170a are positioned at the same level, but are not limited thereto. For example, the upper surface of the insulating structure 175a may be positioned at a higher level than that of the upper surfaces of the plurality of contact structures 170a.

FIG. 21 shows that the lower surface of the insulating structure 175a is positioned at the same vertical level as that of the upper surface of the isolation insulating layer 115L, but is not limited thereto. In some embodiments, the insulating structure 175a may extend into the isolation insulating layer 115L such that a lower surface of the insulating structure 175a is positioned at a lower vertical level than that of the upper surface of the isolation insulating layer 115L. In some embodiments, the insulating structure 175a may pass through the gate capping pattern 166 and extend into the gap-fill insulating layer 164. For example, the lower surface of the insulating structure 175a may be positioned at a lower vertical level than that of the lower surface of the gate capping pattern 166.

FIGS. 22 to 26 are cross-sectional views illustrating a method of manufacturing the semiconductor memory device 2, according to example embodiments. Specifically, FIGS. 22 to 26 are cross-sectional views illustrating the method of manufacturing the semiconductor memory device 2 shown in FIG. 21, taken along a part corresponding to A-A' of FIG. 1.

Figure 22:
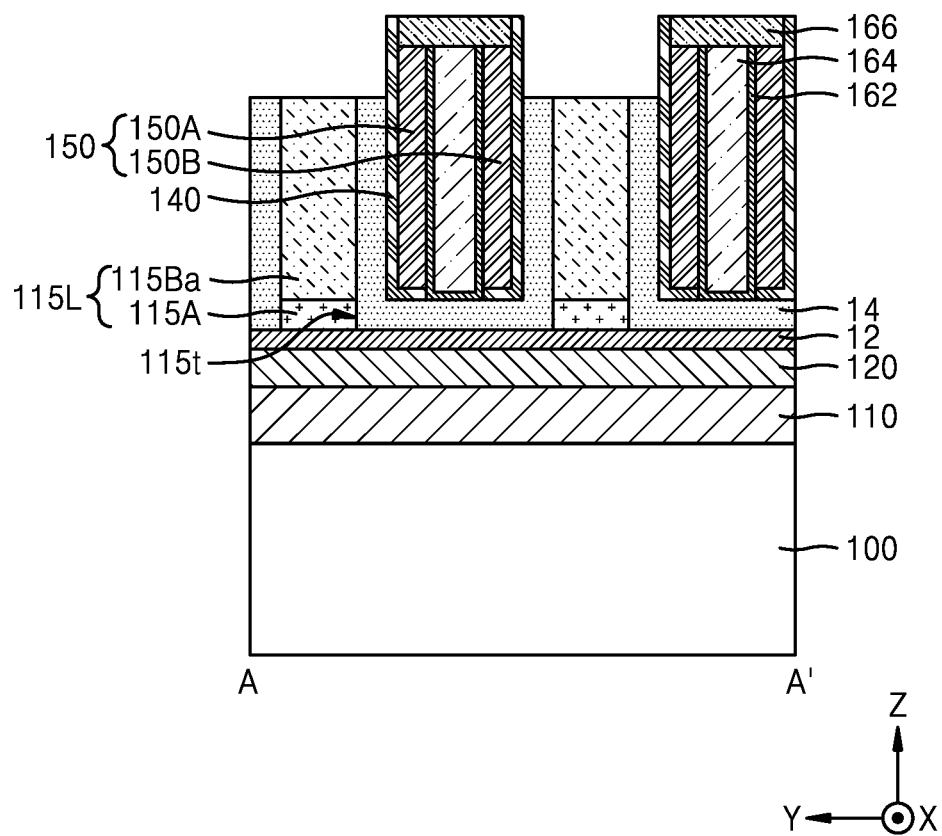
FIGS. 22 to 26 are cross-sectional views illustrating a method of manufacturing a semiconductor memory device, according to example embodiments.

Referring to FIG. 22, the isolation insulating layer 115L is formed by removing a part of upper sides of the plurality of isolation insulating layers 115 shown in FIGS. 15A and 15B, that is, a part of upper sides of the upper isolation insulating layer 115B, and then a part of upper sides of the plurality of amorphous oxide insulating layers 14 is removed. The isolation insulating layer 115L may be formed to have an upper surface positioned at a lower vertical level than that of the uppermost end of the gate electrode 150.

In some embodiments, the uppermost end of the amorphous oxide semiconductor layer 14 may be positioned at the same vertical level as that of the upper surface of the isolation insulating layer 115L by removing a part of the upper side of the of amorphous oxide insulating layer 14, but is not limited thereto. In some other embodiments, the uppermost end of the amorphous oxide semiconductor layer 14 may be positioned at a lower vertical level than that of the upper surface of the isolation insulating layer 115L by removing a part of the upper side of the of amorphous oxide insulating layer 14.

Figure 23:
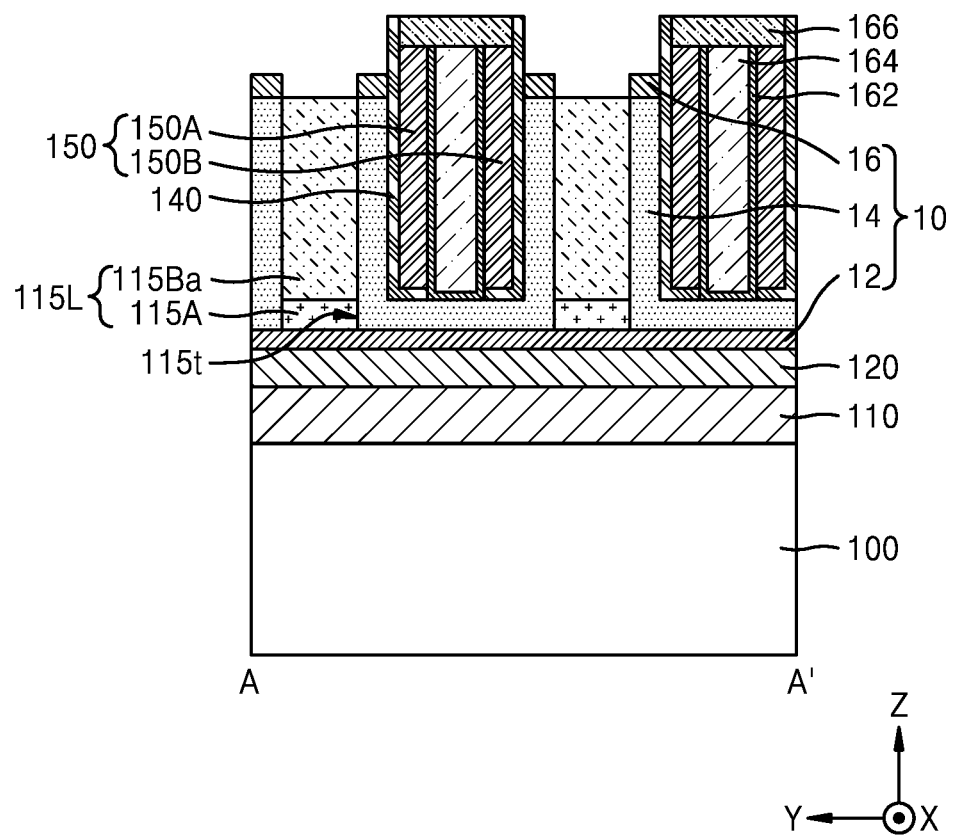

Referring to FIG. 23, the upper crystalline oxide semiconductor layer 16 is formed above the upper surface of the amorphous oxide semiconductor layer 14. The lower crystalline oxide semiconductor layer 12, the amorphous oxide semiconductor layer 14, and the upper crystalline oxide semiconductor layer 16 may constitute the channel structure 10.

Figure 24:
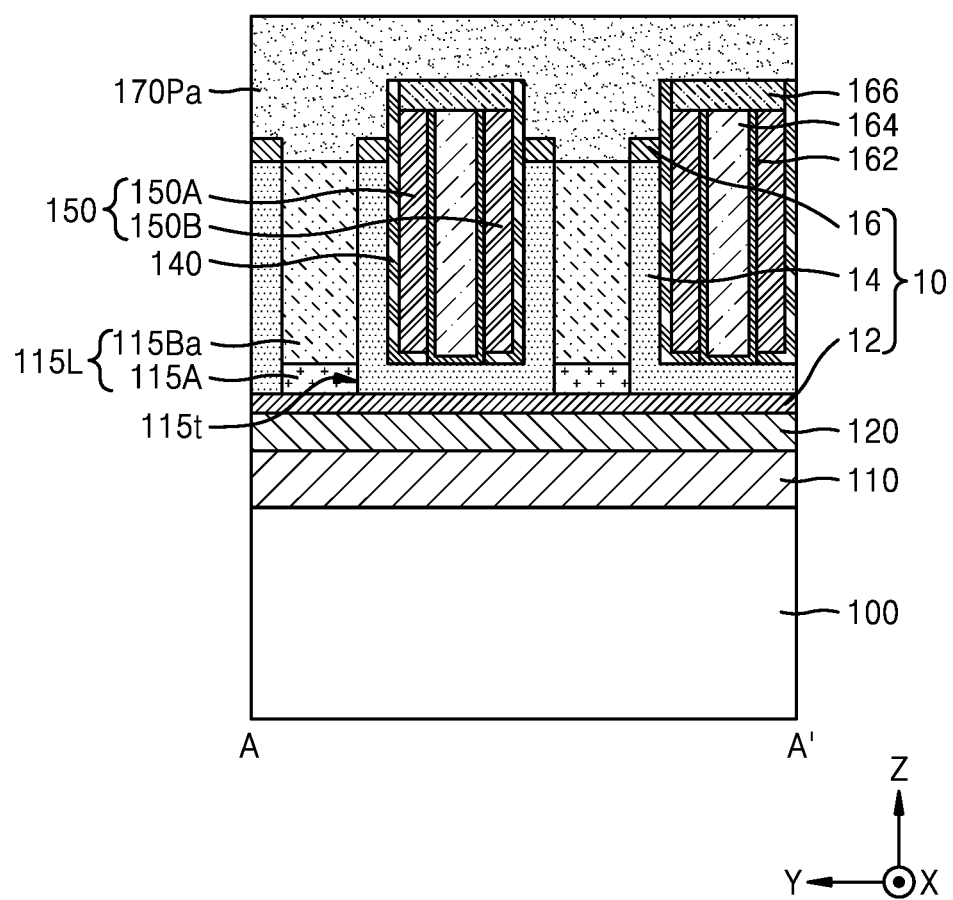

Referring to FIG. 24, a contact material layer 170Pa covering the upper crystalline oxide semiconductor layer 16, the isolation insulating layer 115, and the gate capping pattern 166 is formed. The contact material layer 170Pa may be formed to completely fill space defined between two adjacent gate dielectric layers 140 and to cover the upper surface of the gate capping pattern 166.

Figure 25:
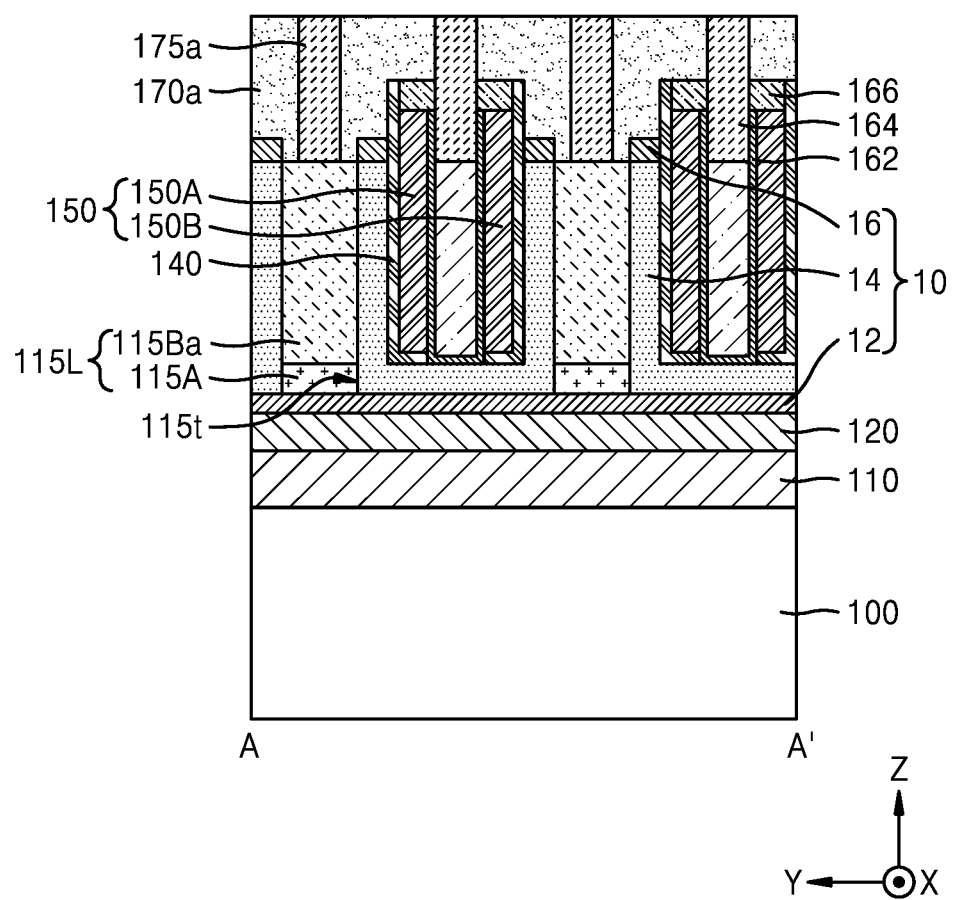

Referring to FIGS. 24 and 25 together, after forming a plurality of contact structures 170a by removing a part of the contact material layer 170Pa, the insulating structure 175a filling space from which a part of the contact material layer 170Pa is removed, that is, space between the plurality of contact structures 170a, is formed.

Figure 26:
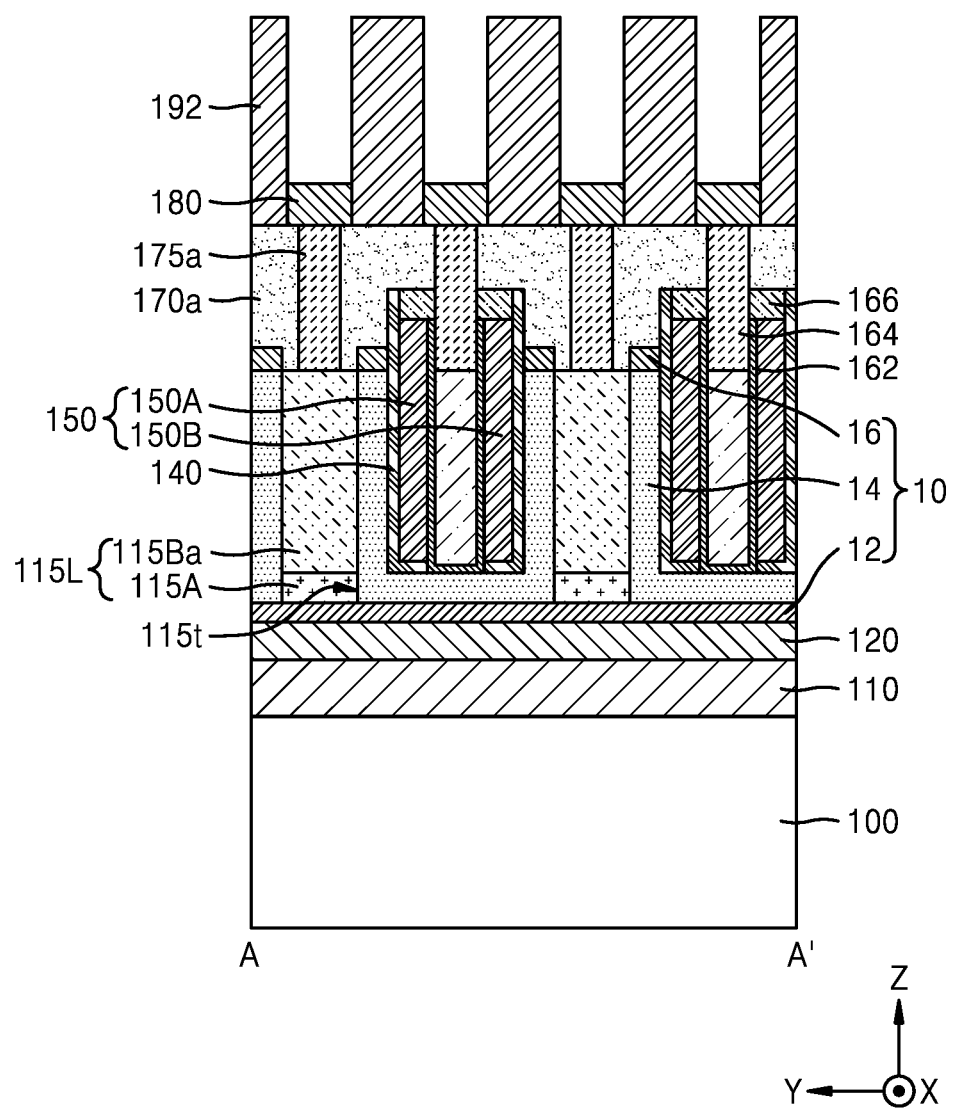

Referring to FIG. 26, the support insulating layer 180 is formed above the plurality of contact structures 170a and the insulating structure 175a. The support insulating layer 180 may include a plurality of holes having bottom surfaces through which the plurality of contact structures 170a are exposed.

A plurality of lower electrodes 192 are respectively formed above the plurality of contact structures 170a. The plurality of lower electrodes 192 may be formed to extend in the vertical direction (Z direction) from the upper surface of the contact structure 170a exposed to the bottom surfaces of the plurality of holes of the support insulating layer 180.

Thereafter, as shown in FIG. 21, the capacitor dielectric layer 194 and the upper electrode 196 are sequentially formed above the plurality of lower electrodes 192, and thus, the semiconductor memory device 2 including the plurality of capacitor structures 190 may be formed FIGS. 27 to 30 are cross-sectional views respectively illustrating semiconductor memory devices 3, 4, 5, and 6 according to example embodiments. Specifically, each of FIGS. 27 to 30 is a cross-sectional view taken along a part corresponding to A-A' of FIG. 1.

Figure 27:
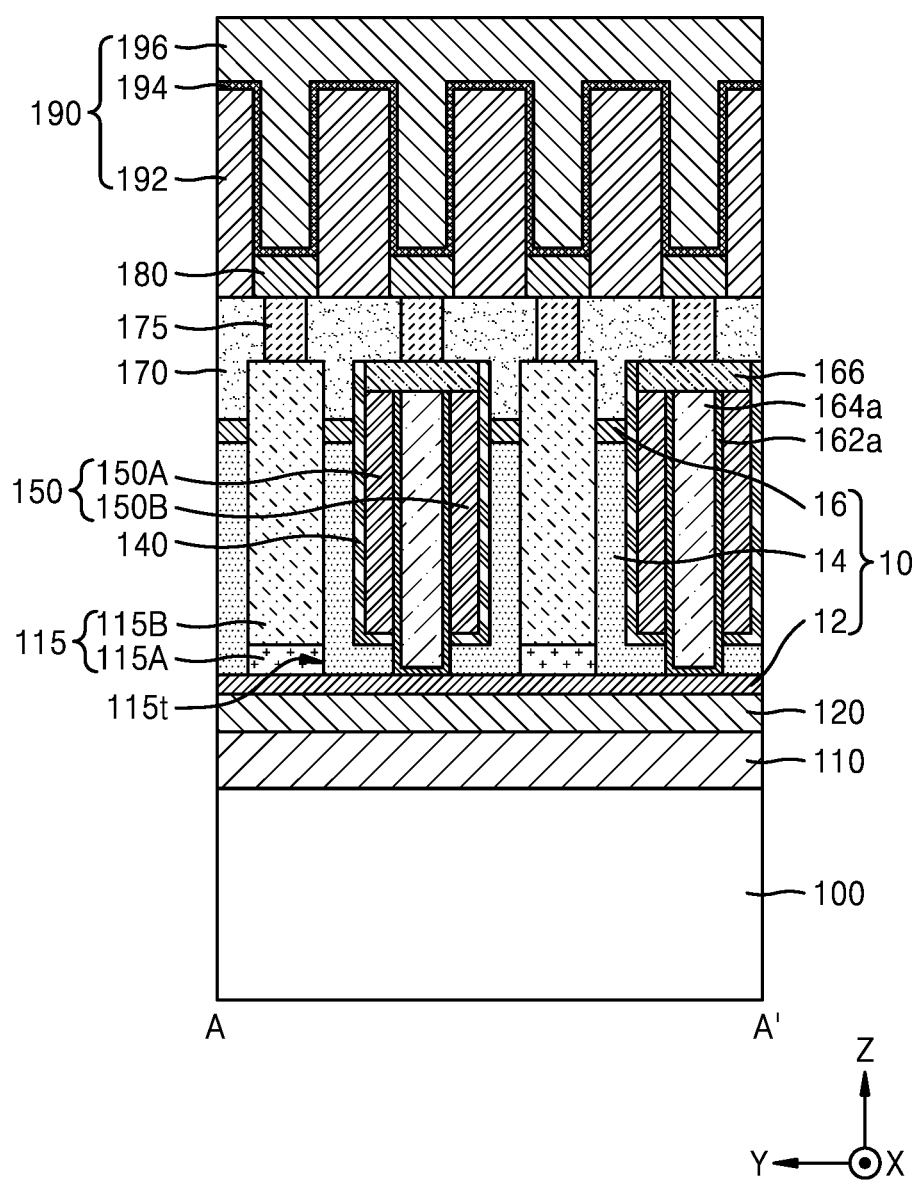
FIGS. 27 to 30 are cross-sectional views illustrating semiconductor memory devices according to example embodiments.

Referring to FIG. 27, the semiconductor memory device 3 may include the substrate 100, the interlayer insulating layer 110, the conductive line 120, the isolation insulating layer 115, the channel structure 10, the gate dielectric layer 140, the gate electrode 150, the contact structure 170, and the capacitor structure 190. The substrate 100, the interlayer insulating layer 110, the conductive line 120, the isolation insulating layer 115, the channel structure 10, the gate dielectric layer 140, the gate electrode 150, the contact structure 170, and the capacitor structure 190 included in the semiconductor memory device 3 are substantially similar to the substrate 100, the interlayer insulating layer 110, the conductive line 120, the isolation insulating layer 115, the channel structure 10, the gate dielectric layer 140, the gate electrode 150, the contact structure 170, and the capacitor structure 190 described with reference to FIGS. 1, 2A, and 2B, respectively, and thus, descriptions redundant with those given with reference to FIGS. 1, 2A, and 2B may be omitted.

Instead of the barrier insulating layer 162 and the gap-fill insulating layer 164 included in the semiconductor memory device 1 shown in FIGS. 2A and 2B, the semiconductor memory device 3 may include a barrier insulating layer 162a and a gap-fill insulating layer 164a. The barrier insulating layer 162a and the gap-fill insulating layer 164a may be between the first gate electrode 150A and the second gate electrode 150B. The first gate electrode 150A and the second gate electrode 150B may be separated from each other by the barrier insulating layer 162a and the gap-fill insulating layer 164a. In some embodiments, the barrier insulating layer 162a may have a U-shaped vertical cross-section, and the gap-fill insulating layer 164a may be formed on the barrier insulating layer 162a to fill the inside of the U-shaped vertical cross-section of the barrier insulating layer 162a and may be filled in a region between the first gate electrode 150A and the second gate electrode 150B. For example, the barrier insulating layer 162a may include silicon nitride, and the gap-fill insulating layer 164a may include silicon oxide.

In the semiconductor memory device 3, the amorphous oxide semiconductor layer 14 includes a first channel portion and a second channel portion separated from each other by the barrier insulating layer 162a and the gap-fill insulating layer 164a and opposite to each other. Each of the first channel portion and the second channel portion may have an L-shaped vertical cross-section. The amorphous oxide semiconductor layer 14 may be cut by the barrier insulating layer 162a and the gap-fill insulating layer 164a to form the first channel portion and the second channel portion. The barrier insulating layer 162a may be in contact with the lower crystalline oxide semiconductor layer 12. For example, the lowermost surface of the barrier insulating layer 162a may be formed equal to or lower than the lowermost surface of the amorphous oxide semiconductor layer 14.

The gate capping pattern 166 may be formed above the gate electrode 150. The gate capping pattern 166 may cover, for example, an upper surface of the gate electrode 150, an upper surface of the barrier insulating layer 162a, and an upper surface of the gap-fill insulating layer 164a.

Figure 28:
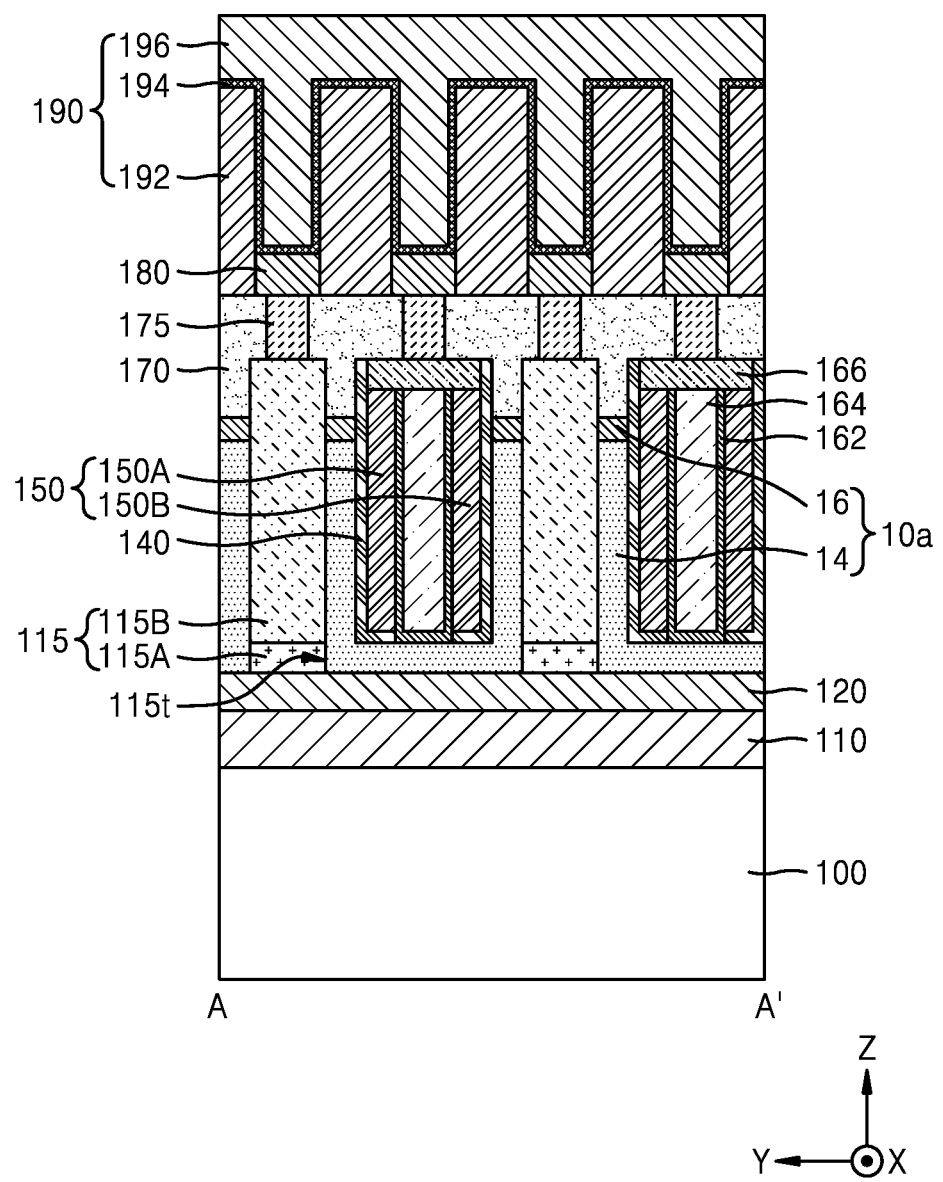

Referring to FIG. 28, the semiconductor memory device 4 may include the substrate 100, the interlayer insulating layer 110, the conductive line 120, the isolation insulating layer 115, a channel structure 10a, the gate dielectric layer 140, the gate electrode 150, the contact structure 170, and the capacitor structure 190. The substrate 100, the interlayer insulating layer 110, the conductive line 120, the isolation insulating layer 115, the gate dielectric layer 140, the gate electrode 150, the contact structure 170, and the capacitor structure 190 included in the semiconductor memory device 4 are substantially similar to the substrate 100, the interlayer insulating layer 110, the conductive line 120, the gate dielectric layer 140, the gate electrode 150, and the capacitor structure 190 described with reference to FIGS. 1, 2A and 2B, and thus descriptions redundant with those given with reference to FIGS. 1, 2A and 2B may be omitted.

The channel structure 10a may include the amorphous oxide semiconductor layer 14 and the upper crystalline oxide semiconductor layer 16. Unlike the channel structure 10 of the semiconductor memory device 1 shown in FIGS. 2A and 2B including the lower crystalline oxide semiconductor layer 12, the amorphous oxide semiconductor layer 14 and the upper crystalline oxide semiconductor layer 16, the channel structure 10a of the semiconductor memory device 4 shown in FIG. 28 includes the amorphous oxide semiconductor layer 14 and the upper crystalline oxide semiconductor layer 16, but may not include the lower crystalline oxide semiconductor layer 12 shown in FIG. 2A.

A lower surface of the amorphous oxide semiconductor layer 14 may be in contact with an upper surface of the conductive line 120. A lower surface of the isolation insulating layer 115, that is, a lower surface of the lower isolation insulating layer 115A, may be in contact with the upper surface of the conductive line 120. In some embodiments, the lower surface of the isolation insulating layer 115, that is, the lower surface of the lower isolation insulating layer 115A, and the upper surface of the conductive line 120 may be positioned at the same vertical level. FIG. 28 shows that the lower surface of the amorphous oxide semiconductor layer 14 is positioned at the same vertical level as that of the upper surface of the conductive line 120, but is not limited thereto. In some embodiments, the amorphous oxide semiconductor layer 14 may extend into the conductive line 120 so that the lower surface of the amorphous oxide semiconductor layer 14 is positioned at a lower vertical level than that of the upper surface of the conductive line 120.

The semiconductor memory device 4 according to the inventive concept may include the channel structure 10a including the upper crystalline oxide semiconductor layer 16. The upper crystalline oxide semiconductor layer 16 has a relatively small contact area and may reduce the contact resistance between the amorphous oxide semiconductor layer 14 and the contact structure 170, so that an electrical characteristic of the semiconductor memory device 4 may be improved, and thus, the performance and reliability of the semiconductor memory device 4 may be improved.

Figure 29:
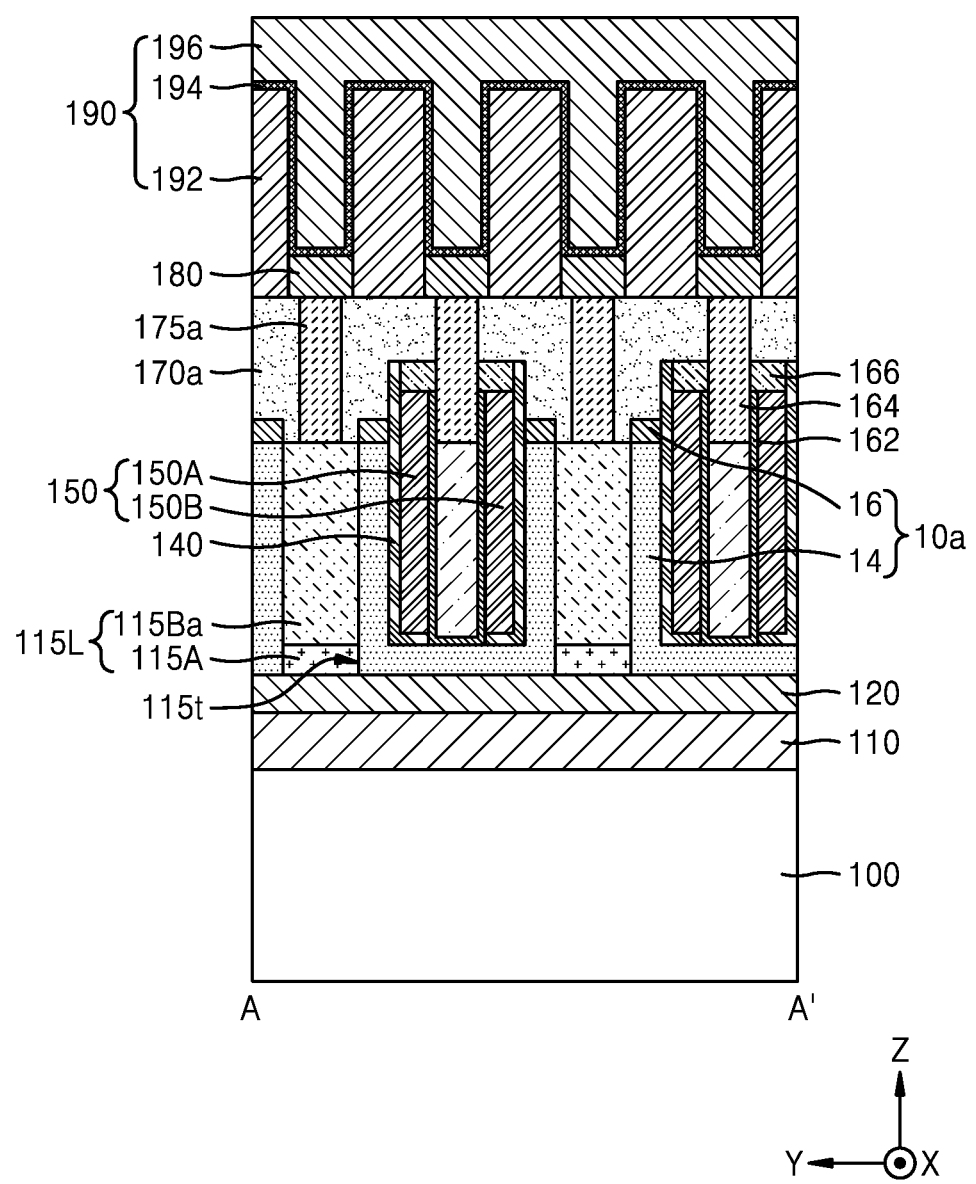

Referring to FIG. 29, the semiconductor memory device 5 may include the substrate 100, the interlayer insulating layer 110, the conductive line 120, the isolation insulating layer 115L, the channel structure 10a, the gate dielectric layer 140, the gate electrode 150, the contact structure 170a, and the capacitor structure 190. The substrate 100, the interlayer insulating layer 110, the conductive line 120, the channel structure 10a, the gate dielectric layer 140, the gate electrode 150, and the capacitor structure 190 included in the semiconductor memory device 5 are substantially the same as the substrate 100, the interlayer insulating layer 110, the conductive line 120, the channel structure 10a, the gate dielectric layer 140, the gate electrode 150, and the capacitor structure 190 described with reference to FIG. 28, and thus descriptions redundant with those given with reference to FIGS. 1, 2A 2B, and 28 may be omitted.

The isolation insulating layer 115L may have a stack structure of the lower isolation insulating layer 115A and the upper isolation insulating layer 115Ba. The upper surface of the isolation insulating layer 115L, that is, the upper surface of the upper isolation insulating layer 115Ba, may be positioned at a lower vertical level than that of the uppermost end of the gate electrode 150. In some embodiments, the upper surface of the isolation insulating layer 115L, that is, the upper surface of the upper isolation insulating layer 115Ba, may be positioned at the same vertical level as that of the uppermost end of the amorphous oxide semiconductor layer 14, but is not limited thereto. In some other embodiments, the upper surface of the isolation insulating layer 115L, that is, the upper surface of the upper isolation insulating layer 115Ba, may be positioned at the same vertical level as that of the uppermost end of the upper crystalline oxide semiconductor layer 16.

The contact structure 170a may be formed above the channel structure 10a. In some embodiments, the contact structure 170a may be connected to the upper surface and side surfaces of the upper crystalline oxide semiconductor layer 16. In some other embodiments, the contact structure 170a may be connected to the upper surface of the upper crystalline oxide semiconductor layer 16. The contact structure 170a may connect the channel structure 10a and the capacitor structure 190 to each other.

Figure 30:
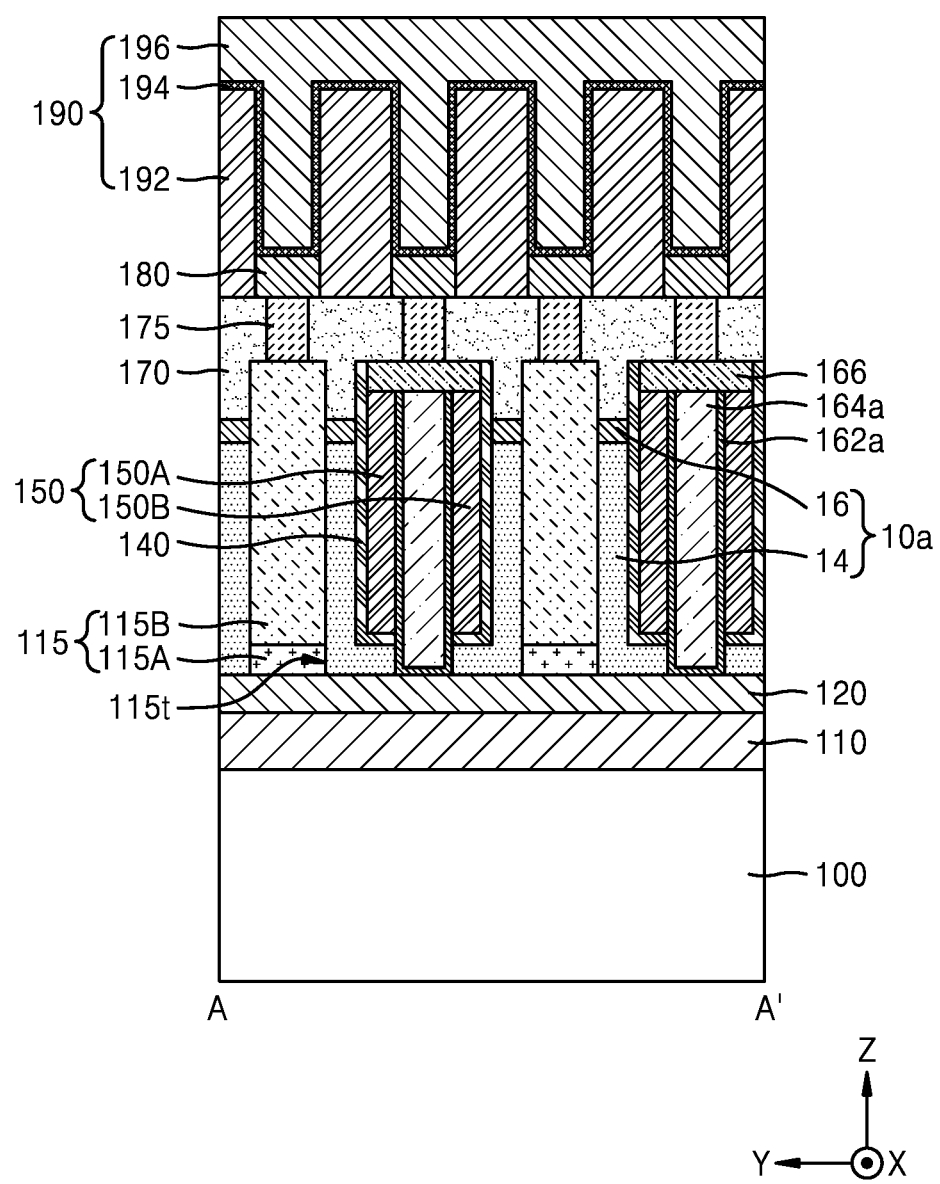

Referring to FIG. 30, the semiconductor memory device 6 may include the substrate 100, the interlayer insulating layer 110, the conductive line 120, the isolation insulating layer 115, the channel structure 10a, the gate dielectric layer 140, the gate electrode 150, the contact structure 170, and the capacitor structure 190. The substrate 100, the interlayer insulating layer 110, the conductive line 120, the isolation insulating layer 115, the gate dielectric layer 140, the gate electrode 150, the contact structure 170, and the capacitor structure 190 included in the semiconductor memory device 6 are substantially similar to the substrate 100, the interlayer insulating layer 110, the conductive line 120, the channel structure 10, the gate dielectric layer 140, the gate electrode 150, and the capacitor structure 190 described with reference to FIGS. 1, 2A, and 2B and the channel structure 10a described with reference to FIG. 28, and thus descriptions redundant with those given with reference to FIGS. 1, 2A and 2B and descriptions redundant with those given with reference to FIG. 28 may be omitted.

Instead of the barrier insulating layer 162 and the gap-fill insulating layer 164 included in the semiconductor memory device 4 shown in FIG. 28, the semiconductor memory device 6 may include the barrier insulating layer 162a and the gap-fill insulating layer 164a. The barrier insulating layer 162a and the gap-fill insulating layer 164a may be between the first gate electrode 150A and the second gate electrode 150B. The first gate electrode 150A and the second gate electrode 150B may be separated from each other by the barrier insulating layer 162a and the gap-fill insulating layer 164a. In some embodiments, the barrier insulating layer 162a may have a U-shaped vertical cross-section, and the gap-fill insulating layer 164a may be formed on the barrier insulating layer 162a to fill the inside of the U-shaped vertical cross-section of the barrier insulating layer 162a and may be filled in a region between the first gate electrode 150A and the second gate electrode 150B.

In the semiconductor memory device 6, the amorphous oxide semiconductor layer 14 includes a first channel portion and a second channel portion separated from each other by the barrier insulating layer 162a and the gap-fill insulating layer 164a and opposite to each other. Each of the first channel portion and the second channel portion may have an L-shaped vertical cross-section. The amorphous oxide semiconductor layer 14 may be cut by the barrier insulating layer 162a and the gap-fill insulating layer 164a to form the first channel portion and the second channel portion. The barrier insulating layer 162a may be in contact with the conductive line 120. For example, the lowermost surface of the barrier insulating layer 162a may be formed equal to or lower than the lowermost surface of the amorphous oxide semiconductor layer 14.

A gate capping pattern 166 may be formed above the gate electrode 150. The gate capping pattern 166 may cover, for example, an upper surface of the gate electrode 150, an upper surface of the barrier insulating layer 162a, and an upper surface of the gap-fill insulating layer 164a.

While the inventive concept has been particularly shown and described with reference to embodiments thereof, it will be understood that various changes in form and details may be made therein without departing from the spirit and scope of the following claims.

What is claimed is:
1. A semiconductor memory device comprising:
a substrate;
a conductive line extending in a first horizontal direction above the substrate;
an isolation insulating layer comprising a channel trench extending in a second horizontal direction intersecting with the first horizontal direction and extending from an upper surface to a lower surface of the isolation insulating layer, above the conductive line;
a channel structure disposed above the conductive line;
a gate electrode extending in the second horizontal direction, in the channel trench;
a capacitor structure above the isolation insulating layer; and
a contact structure between the channel structure and the capacitor structure,
wherein the channel structure comprises an amorphous oxide semiconductor layer disposed in the channel trench above the conductive line, and an upper crystalline oxide semiconductor layer between the amorphous oxide semiconductor layer and the contact structure.

2. The semiconductor memory device of claim 1, wherein the channel structure further comprises a lower crystalline oxide semiconductor layer interposed between the conductive line and the amorphous oxide semiconductor layer.

3. The semiconductor memory device of claim 2, wherein the isolation insulating layer is disposed above the lower crystalline oxide semiconductor layer.

4. The semiconductor memory device of claim 2, wherein the lower crystalline oxide semiconductor layer extends in the first horizontal direction above the conductive line.

5. The semiconductor memory device of claim 4, wherein both side surfaces of the lower crystalline oxide semiconductor layer and both side surfaces of the conductive line are aligned in a vertical direction.

6. The semiconductor memory device of claim 1, wherein the amorphous oxide semiconductor layer has a U-shaped vertical cross-section in the first horizontal direction.

7. The semiconductor memory device of claim 6, wherein the upper crystalline oxide semiconductor layer comprises:
a first upper crystalline oxide semiconductor layer disposed above a first upper surface of the amorphous oxide semiconductor layer; and
a second upper crystalline oxide semiconductor layer disposed above a second upper surface of the amorphous oxide semiconductor layer and spaced apart from the first upper crystalline oxide semiconductor layer, and
wherein the amorphous oxide semiconductor layer and the first and second upper crystalline oxide semiconductor layers have the U-shaped vertical cross-section in the first horizontal direction.

8. The semiconductor memory device of claim 6, further comprising:
a gate dielectric layer interposed between the channel structure and the gate electrode.

9. The semiconductor memory device of claim 8, wherein the gate dielectric layer comprises:
first and second gate dielectric layers each having an L-shaped vertical cross-section along an inner surface of the channel structure, facing each other, and spaced apart from each other.

10. The semiconductor memory device of claim 1, wherein the gate electrode comprises a first gate electrode and a second gate electrode spaced apart from each other in the first horizontal direction to face each other in the channel trench and extending in the second horizontal direction, further comprising:

a barrier insulating layer disposed between the first gate electrode and the second gate electrode; and a gap-fill insulating layer disposed on the barrier insulating layer and filling a region between the first gate electrode and the second gate electrode.

11. A semiconductor memory device comprising:

a substrate;

a conductive line extending in a first horizontal direction above the substrate;

an isolation insulating layer comprising a channel trench extending in a second horizontal direction intersecting with the first horizontal direction and extending from an upper surface to a lower surface of the isolation insulating layer, above the conductive line;

a channel structure disposed above the conductive line;

a gate electrode extending in the second horizontal direction, in the channel trench;

a gate dielectric layer interposed between the channel structure and the gate electrode, in the channel trench;

a capacitor structure above the isolation insulating layer; and a contact structure interposed between the channel structure and the capacitor structure, wherein the channel structure comprises:

a lower crystalline oxide semiconductor layer extending in the first horizontal direction above the conductive line;

an amorphous oxide semiconductor layer disposed in the channel trench above the lower crystalline oxide semiconductor layer; and an upper crystalline oxide semiconductor layer interposed between the amorphous oxide semiconductor layer and the contact structure.

12. The semiconductor memory device of claim 11, wherein the isolation insulating layer is disposed above the lower crystalline oxide semiconductor layer such that a lower surface of the isolation insulating layer and an upper surface of the lower crystalline oxide semiconductor layer are positioned at a same vertical level.

13. The semiconductor memory device of claim 11, wherein:

an upper surface of the upper crystalline oxide semiconductor layer is positioned at a lower vertical level than a level of an upper surface of the gate electrode, and the contact structure is connected to the upper surface of the upper crystalline oxide semiconductor layer.

14. The semiconductor memory device of claim 11, wherein:

the amorphous oxide semiconductor layer has a U-shaped vertical cross-section in the first horizontal direction, and the gate dielectric layer comprises first and second gate dielectric layers each having an L-shaped vertical cross-section along an inner surface of the channel structure, facing each other, and spaced apart from each other.

15. The semiconductor memory device of claim 14, wherein:

the gate electrode comprises a first gate electrode and a second gate electrode spaced apart from each other in the first horizontal direction to face each other in the channel trench and extending in the second horizontal direction, the first gate dielectric layer is interposed between the channel structure and the first gate electrode, and the second gate dielectric layer is interposed between the channel structure and the second gate electrode.

16. The semiconductor memory device of claim 14, wherein the upper crystalline oxide semiconductor layer comprises:

a first upper crystalline oxide semiconductor layer disposed above a first upper surface of the amorphous oxide semiconductor layer; and a second upper crystalline oxide semiconductor layer disposed above a second upper surface of the amorphous oxide semiconductor layer and spaced apart from the first upper crystalline oxide semiconductor layer, and wherein the amorphous oxide semiconductor layer and the first and second upper crystalline oxide semiconductor layers have a U-shaped vertical cross-section in the first horizontal direction.

17. The semiconductor memory device of claim 11, wherein the lower crystalline oxide semiconductor layer and the conductive line overlap each other in a vertical direction.

18. A semiconductor memory device comprising:

a substrate;

a conductive line extending in a first horizontal direction above the substrate;

an isolation insulating layer comprising a channel trench extending in a second horizontal direction intersecting with the first horizontal direction and extending from an upper surface to a lower surface of the isolation insulating layer, above the conductive line;

a channel structure disposed above the conductive line;

a gate electrode comprising a first gate electrode and a second gate electrode spaced apart from each other in the first horizontal direction to face each other in the channel trench and extending in the second horizontal direction;

a gate dielectric layer interposed between the channel structure and the gate electrode, in the channel trench;

a barrier insulating layer disposed between the first gate electrode and the second gate electrode;

a gap-fill insulating layer disposed on the barrier insulating layer and filling a region between the first gate electrode and the second gate electrode;

a gate capping pattern covering upper surfaces of the gate electrode, the barrier insulating layer, and the gap-fill insulating layer;

a capacitor structure above the isolation insulating layer and the gate capping pattern; and a contact structure interposed between the channel structure and the capacitor structure, wherein the channel structure comprises:

a lower crystalline oxide semiconductor layer having a lower surface covering an upper surface of the conductive line and extending in the first horizontal direction;

an amorphous oxide semiconductor layer disposed in the channel trench above the lower crystalline oxide semiconductor layer and having a U-shaped vertical cross-section in the first horizontal direction; and first and second upper crystalline oxide semiconductor layers spaced apart from each other and interposed between the amorphous oxide semiconductor layer and the contact structure, and wherein the first upper crystalline oxide semiconductor is disposed above a first upper surface of the amorphous oxide semiconductor layer, and the second upper crystalline oxide semiconductor layer is disposed above a second upper surface of the amorphous oxide semiconductor layer.

19. The semiconductor memory device of claim 18, wherein:

the amorphous oxide semiconductor layer comprises indium gallium zinc oxide (IGZO), and each of the lower crystalline oxide semiconductor layer and the first and second upper crystalline oxide semiconductor layers comprises c-axis aligned crystalline (CAAC) IGZO.

20. The semiconductor memory device of claim 18, wherein the contact structure extends between the isolation insulating layer and the gate dielectric layer from upper surfaces of the isolation insulating layer and the gate capping pattern, and is connected to the first and second upper crystalline oxide semiconductor layers.

\* \* \* \* \*